(12) United States Patent
Xie et al.

(10) Patent No.: US 9,171,934 B2
(45) Date of Patent: Oct. 27, 2015

(54) METHODS OF FORMING SEMICONDUCTOR DEVICES USING A LAYER OF MATERIAL HAVING A PLURALITY OF TRENCHES FORMED THEREIN

(71) Applicant: GLOBALFOUNDRIES Inc., Grand Cayman (KY)

(72) Inventors: Ruilong Xie, Niskayuna, NY (US); William J. Taylor, Jr., Clifton Park, NY (US); Ryan Ryoung-Han Kim, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/242,329

(22) Filed: Apr. 1, 2014

(65) Prior Publication Data

US 2015/0279972 A1    Oct. 1, 2015

(51) Int. Cl.
| | |
|---|---|
| *H01L 21/336* | (2006.01) |
| *H01L 29/66* | (2006.01) |
| *H01L 29/51* | (2006.01) |
| *H01L 21/02* | (2006.01) |
| *H01L 21/265* | (2006.01) |
| *H01L 21/28* | (2006.01) |
| *H01L 29/417* | (2006.01) |
| *H01L 29/423* | (2006.01) |
| *H01L 29/08* | (2006.01) |

(52) U.S. Cl.
CPC ...... *H01L 29/66795* (2013.01); *H01L 21/0257* (2013.01); *H01L 21/26513* (2013.01); *H01L 21/28017* (2013.01); *H01L 29/0847* (2013.01); *H01L 29/41791* (2013.01); *H01L 29/42356* (2013.01); *H01L 29/517* (2013.01)

(58) Field of Classification Search
CPC ............... H01L 21/845; H01L 21/823431
USPC .................................................. 438/149–159
See application file for complete search history.

(56) References Cited

U.S. PATENT DOCUMENTS

| | | | | |
|---|---|---|---|---|
| 7,279,375 | B2* | 10/2007 | Radosavljevic et al. | 438/197 |
| 8,367,498 | B2* | 2/2013 | Chang et al. | 438/268 |
| 8,859,378 | B2* | 10/2014 | Liang et al. | 438/300 |
| 2013/0285155 | A1 | 10/2013 | Glass et al. | |
| 2014/0001520 | A1 | 1/2014 | Glass et al. | |
| 2015/0144998 | A1* | 5/2015 | Ching et al. | 438/283 |

OTHER PUBLICATIONS

Office Action from related U.S. Appl. No. 14/242,416 dated Apr. 20, 2015.

* cited by examiner

*Primary Examiner* — Cuong Q Nguyen
(74) *Attorney, Agent, or Firm* — Amerson Law Firm, PLLC

(57) ABSTRACT

One method disclosed includes, among other things, forming a plurality of laterally spaced-apart source/drain trenches and a gate trench in a layer of material above an active region, performing at least one process operation through the spaced-apart source/drain trenches to form doped source/drain regions, forming a gate structure within the gate trench, and forming a gate cap layer above the gate structure positioned within the gate trench.

31 Claims, 30 Drawing Sheets

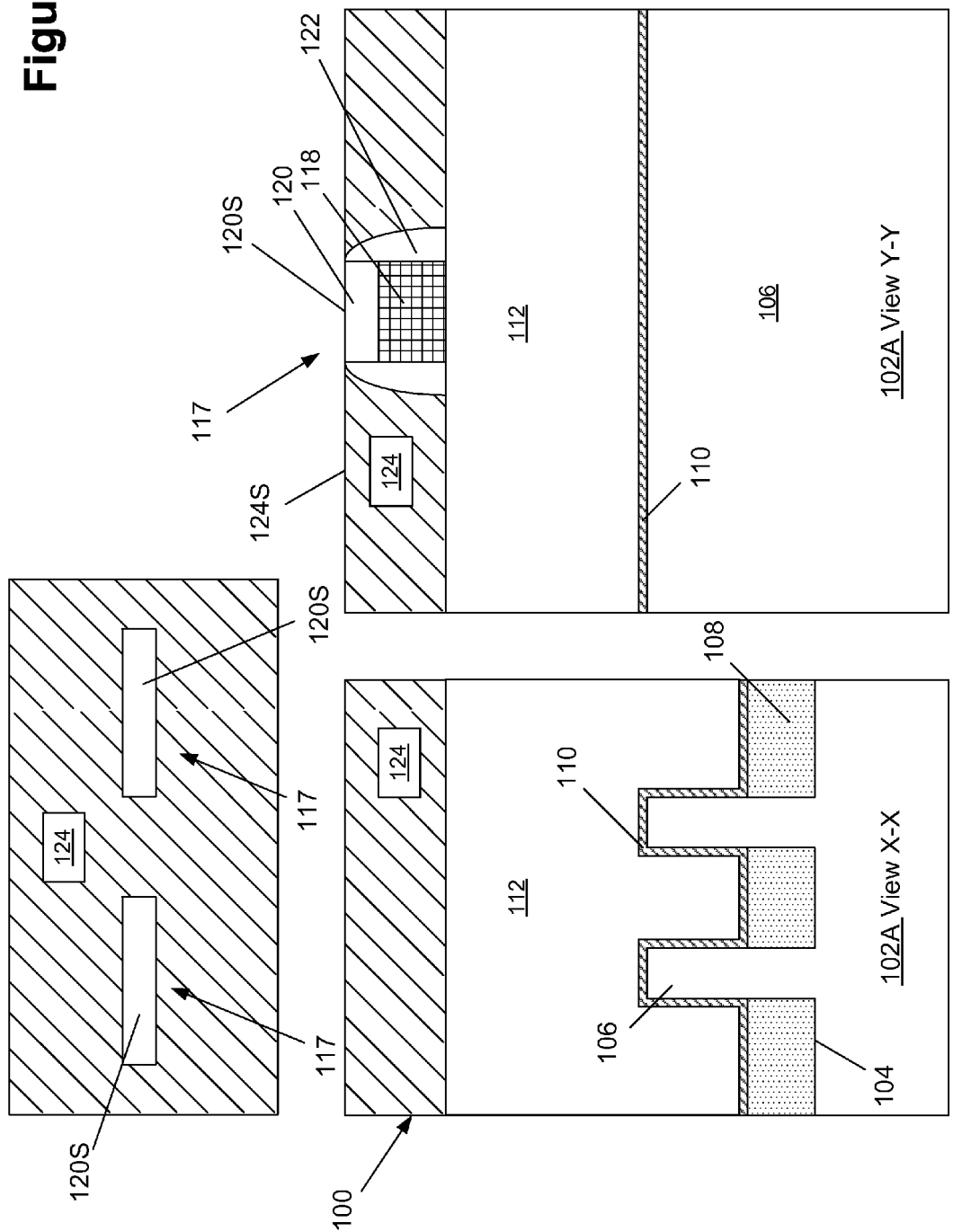

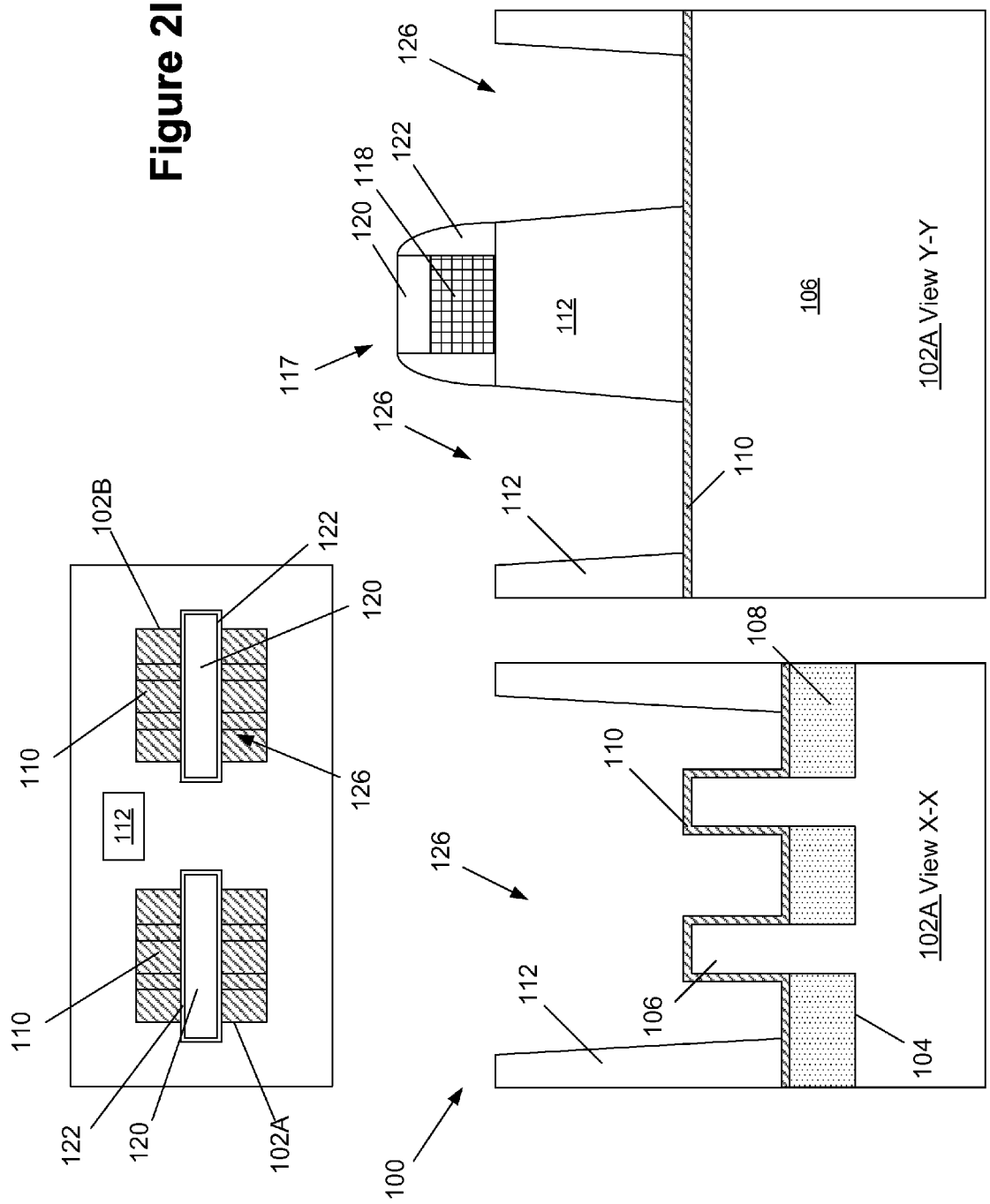

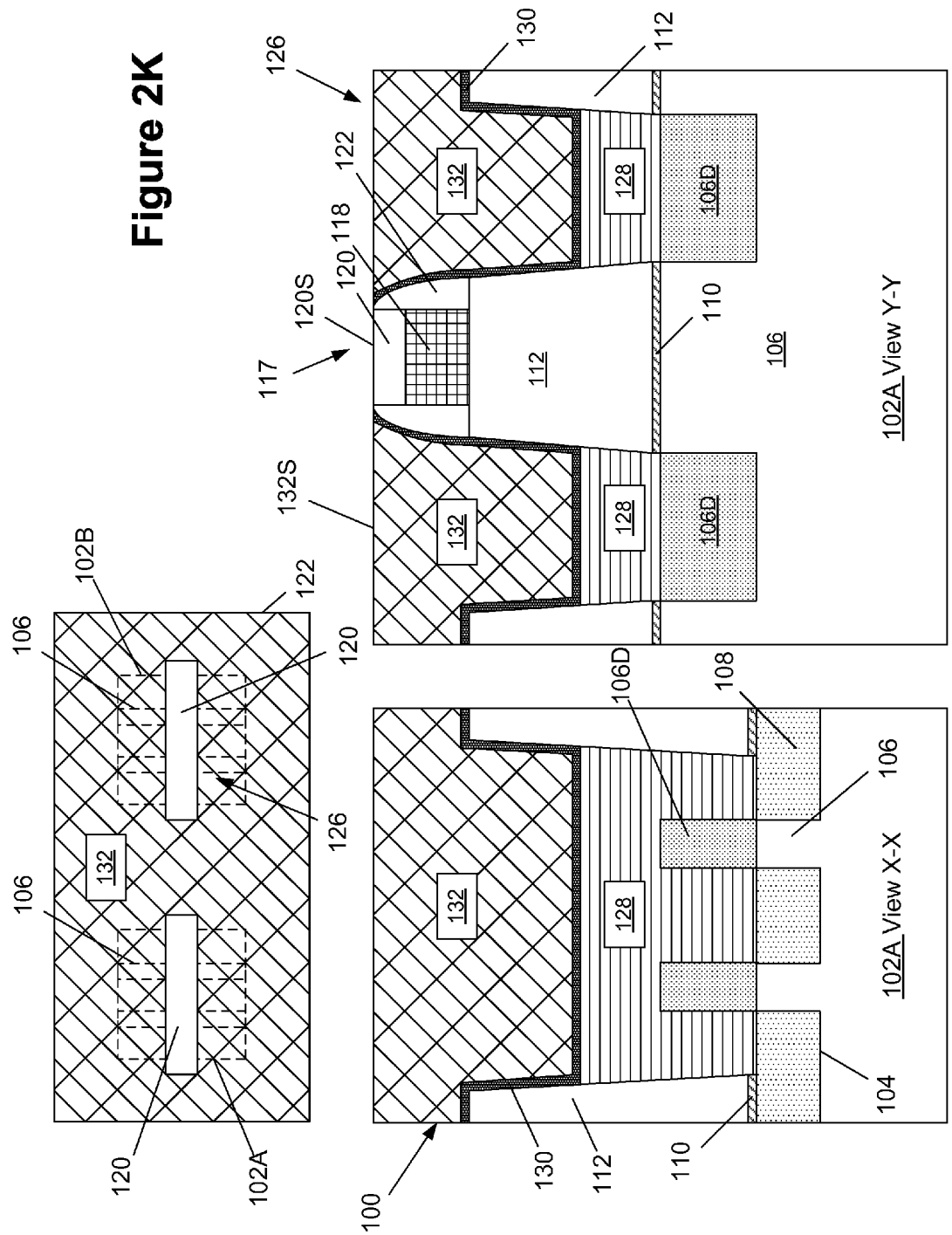

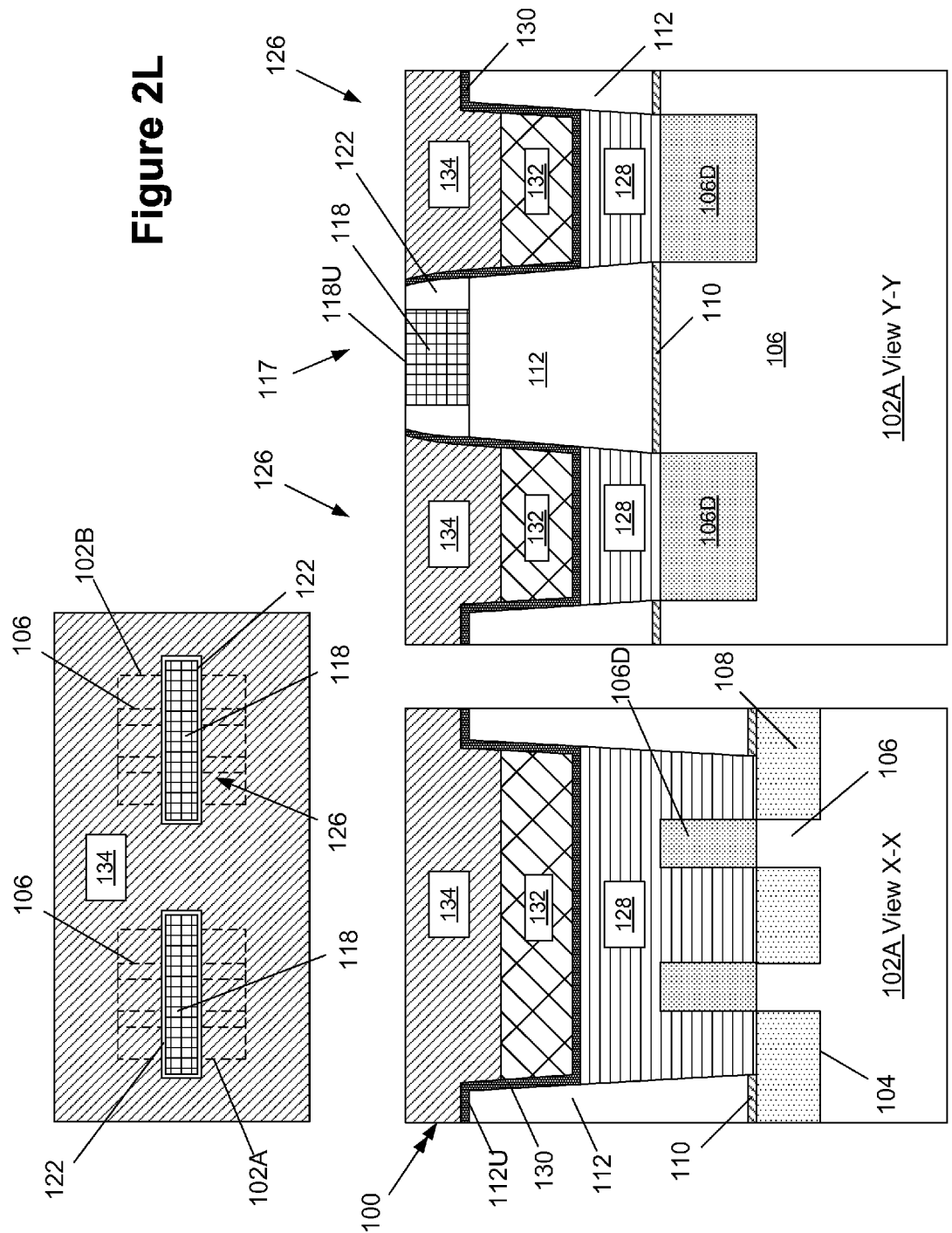

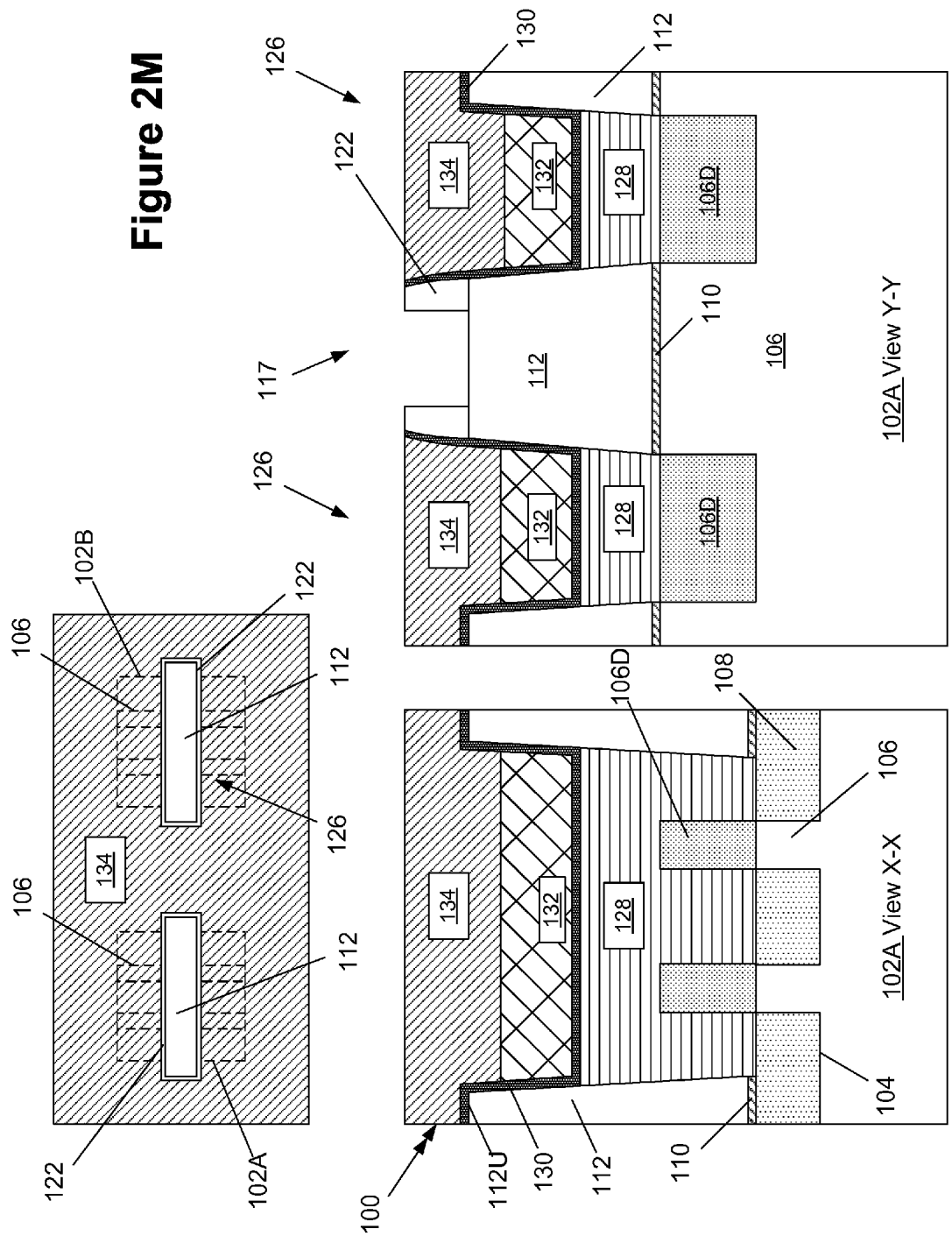

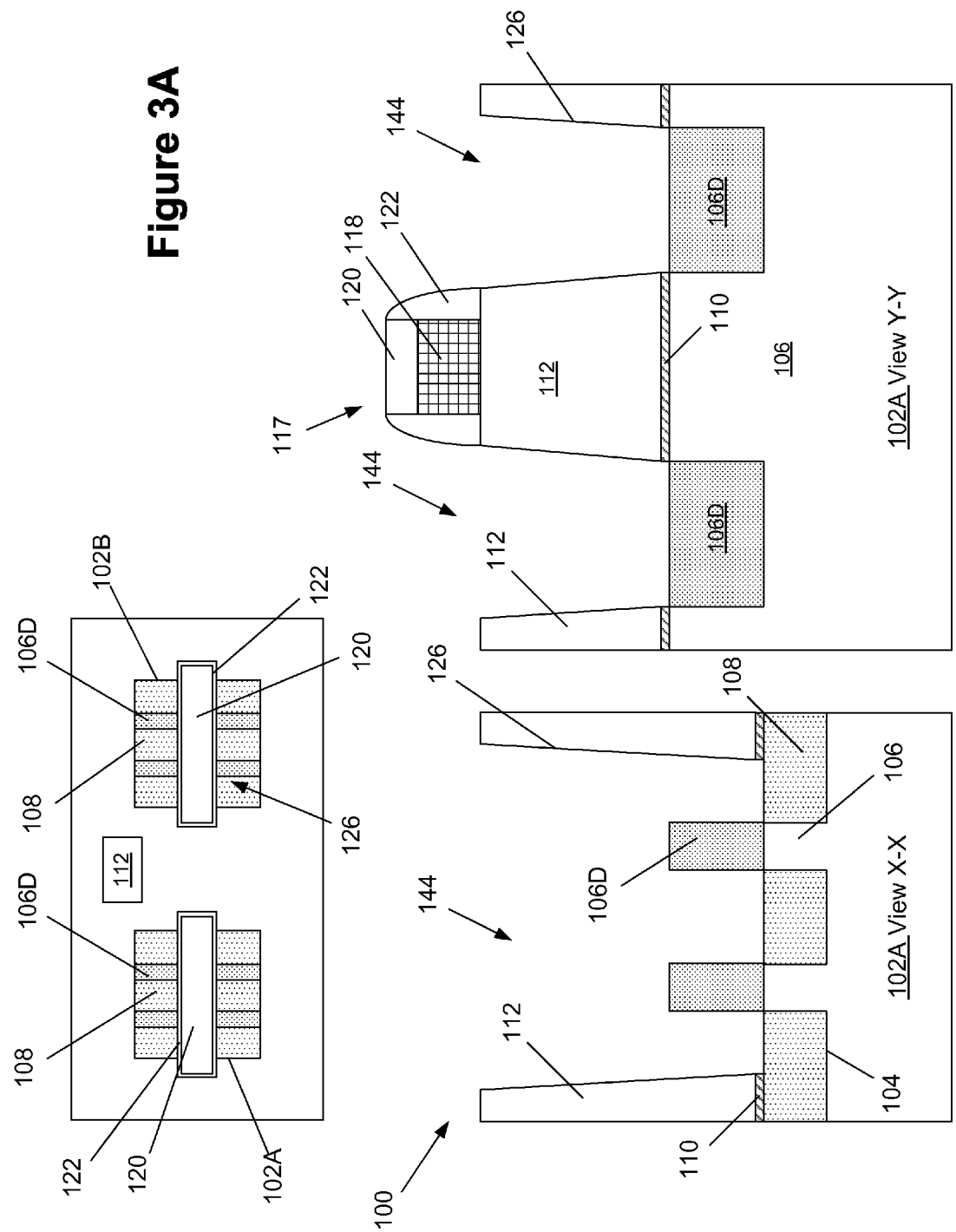

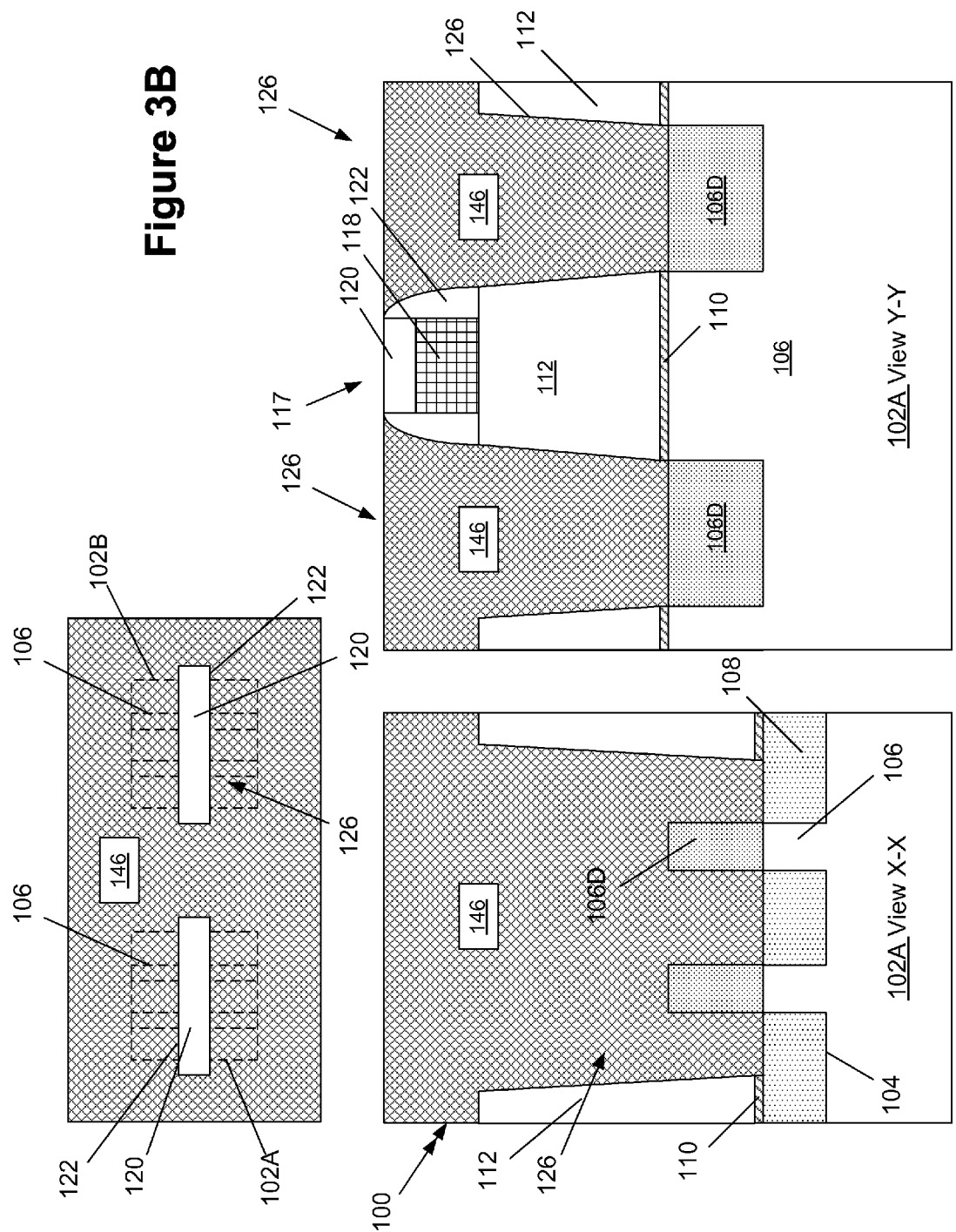

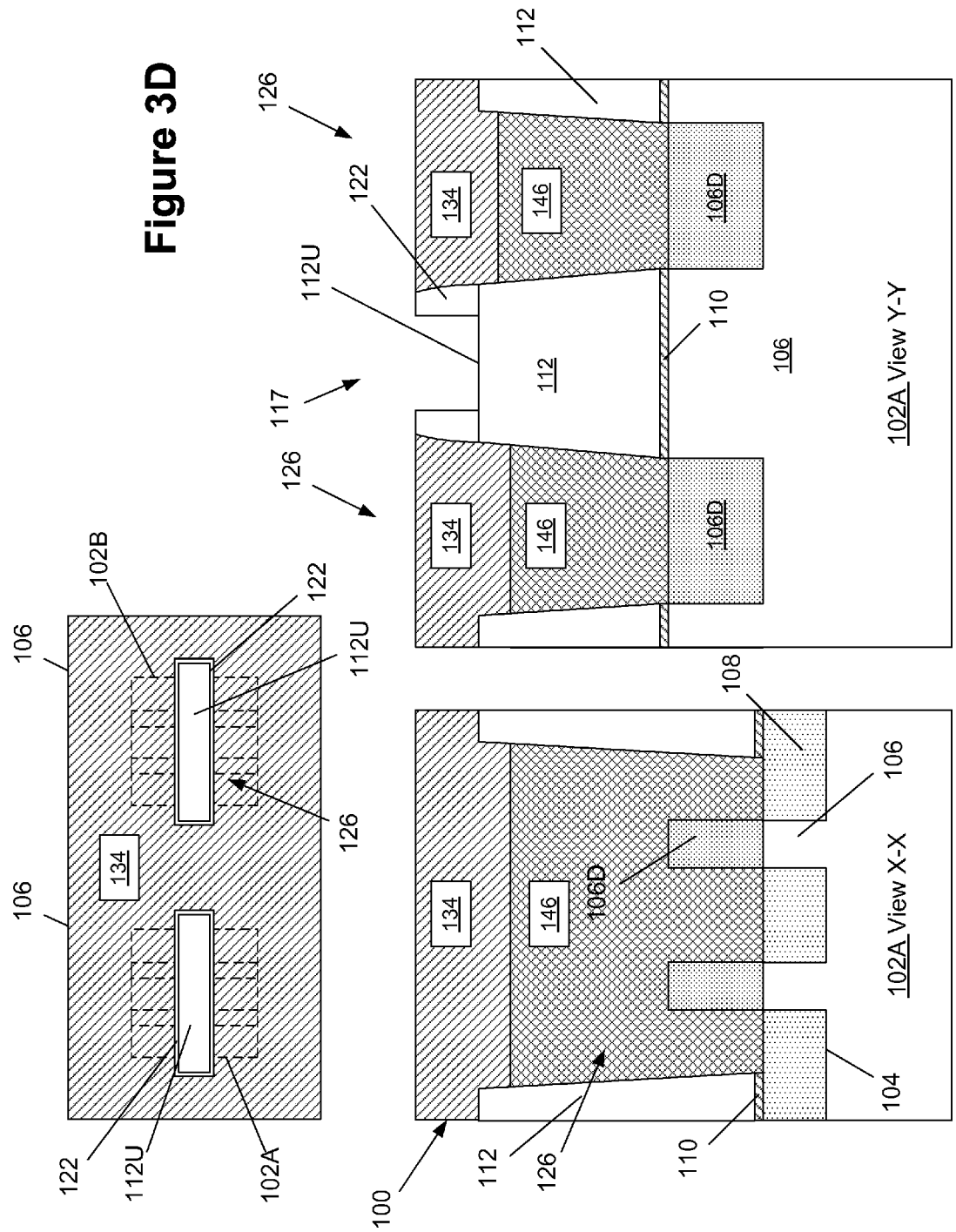

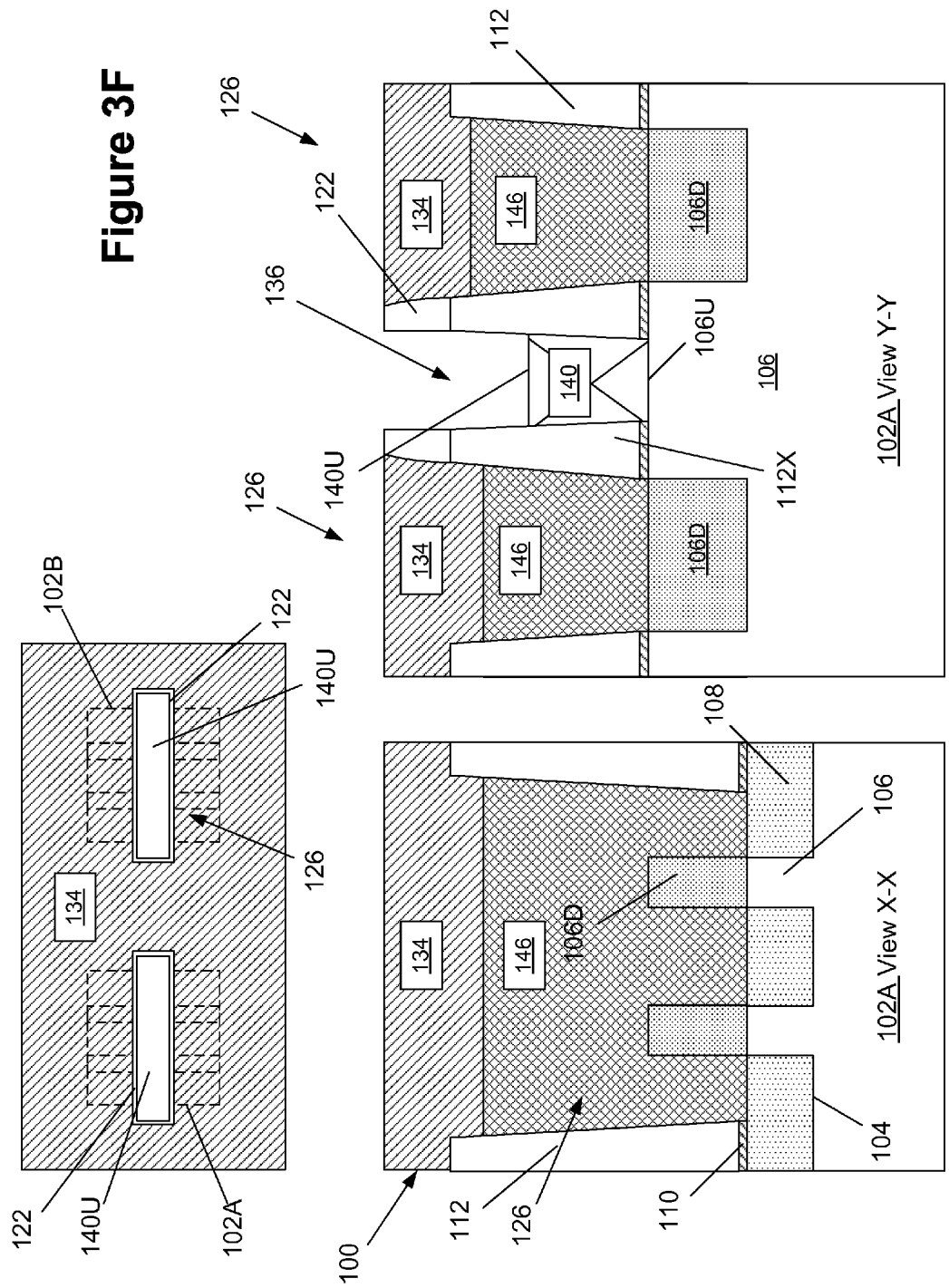

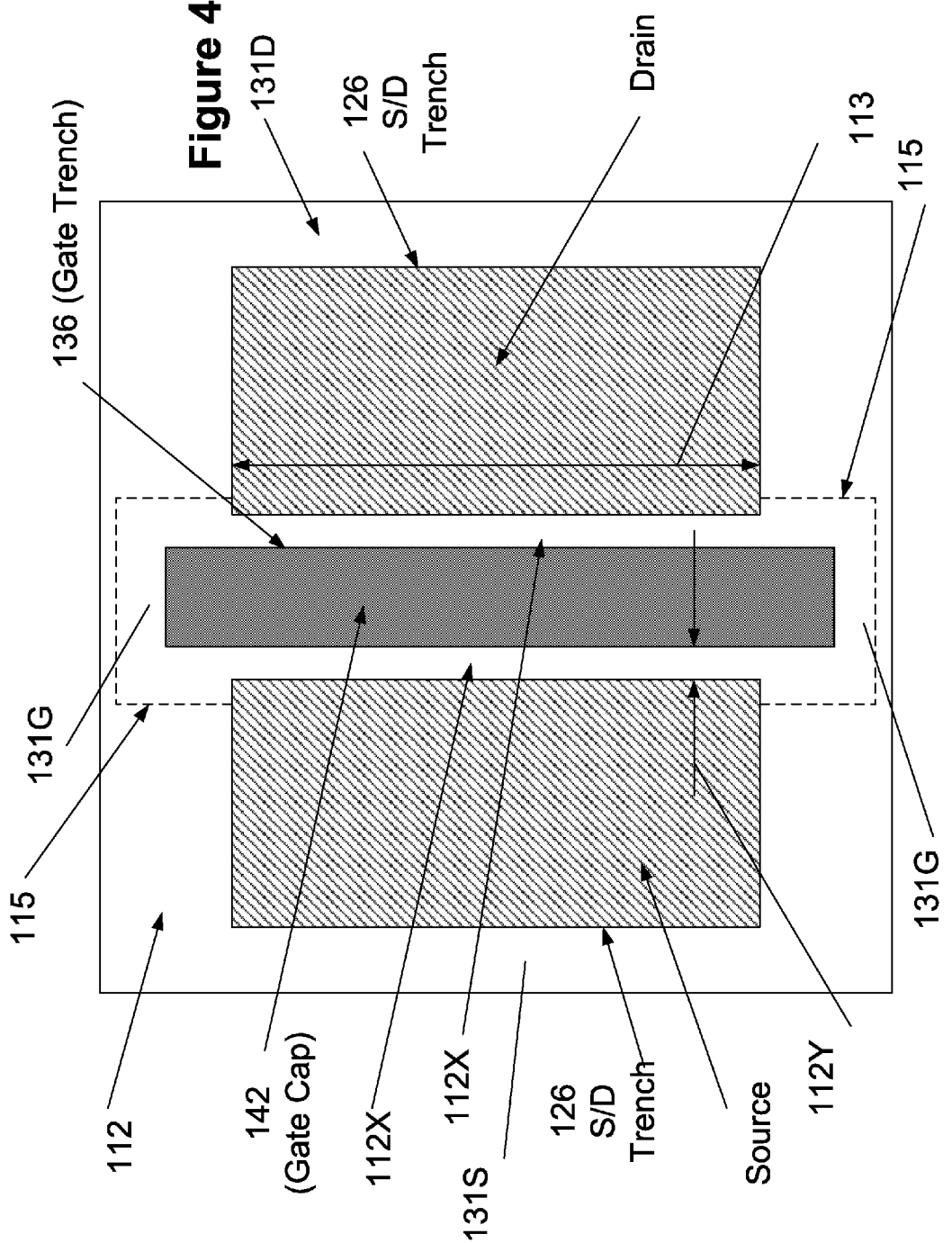

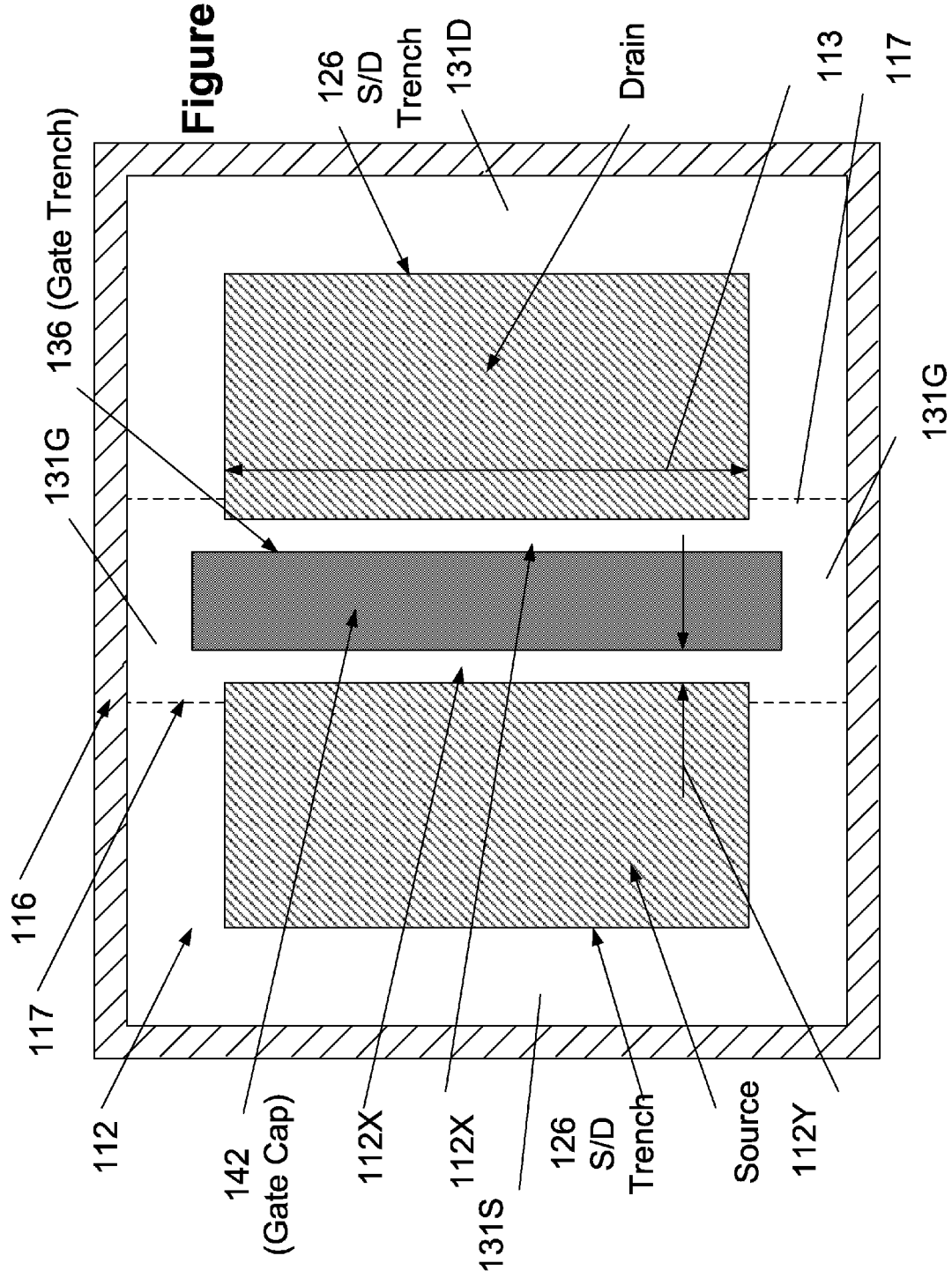

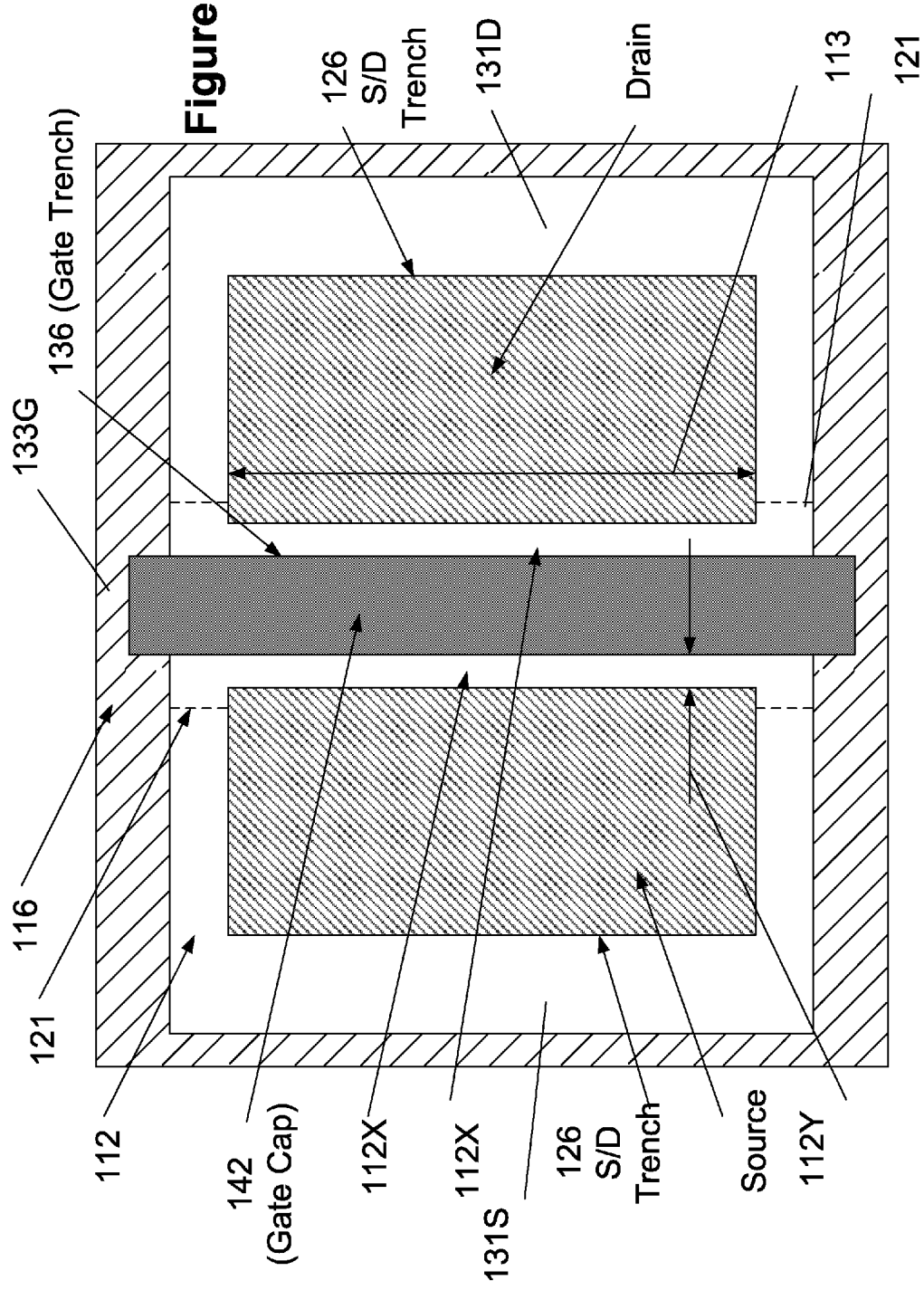

METHODS OF FORMING SEMICONDUCTOR DEVICES USING A LAYER OF MATERIAL HAVING A PLURALITY OF TRENCHES FORMED THEREIN

BACKGROUND OF THE INVENTION

1. Field of the Invention

The present disclosure generally relates to the fabrication of integrated circuits, and, more particularly, to various methods of forming a semiconductor device using a layer of material having a plurality of trenches formed therein and the resulting semiconductor device.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

As device dimensions continue to shrink, the physical size of the fins (width and height) of a FinFET device are also reduced. As a result, the fins are very small structures in the world of semiconductor processing. Moreover, due to the prior art manner in which FinFET devices are made, the fins are subjected to numerous cleaning and etching processes that undesirably remove portions of the fin structures in the source/drain regions of the device despite best efforts to use highly selective etch/cleaning chemistries. Traditionally, the fins are the first components of a FinFET device that are formed. They are formed by performing an etching process through a patterned etch mask to define the fins in the substrate. Thereafter, a gate structure (either a final gate structure or a sacrificial gate structure) is formed above the channel region of the fins, by performing one or more reactive ion etching processes to pattern the gate materials and a gate cap layer. Thereafter, sidewall spacers are formed adjacent the gate structure by depositing a layer of spacer material and performing another reactive ion etching process to remove desired portions of the layer of spacer material, leaving sidewall spacers formed adjacent the gate structure. Later in the processing operation, an epi pre-clean process will be performed on the fins in the source/drain region of the device prior to forming an epi semiconductor material on the fins in the source/drain regions. From the brief explanation above, the fins in the source/drain regions are subjected to at least two reactive ion etching processes (gate patterning and spacer formation), as well as the epi pre-clean process, all of which tend to undesirably remove fin material.

In some cases, damage to the fin structures in the source/drain regions of the device may not be a significant concern, i.e., an application in which there may be significant growth of epi material in the source/drain regions. Nevertheless, even in those situations, problems can occur if too much of the epi material is grown in the source/drain regions of the device, e.g., epi-to-epi shorting between adjacent devices or around the end of the gate structure on a single device.

Another area of potential concern is related to the formation of so-called self-aligned contacts. The typical process flow for forming such contacts involves forming an opening in a layer of silicon dioxide that is supposed to stop on a silicon nitride gate cap layer and a silicon nitride sidewall spacer (that are formed to protect the gate materials). Unfortunately, there is a risk of consuming too much of the gate cap layer and/or the sidewall spacer during the contact opening etching process which can lead to exposure of the gate materials. When the contact is formed in the contact opening, there is a chance of creating a contact-to-gate electrical short due to the loss of the cap and/or spacer material.

FIG. 1B is a simplistic plan view of an illustrative transistor device (which can be either a planar or FinFET device). As depicted, the transistor is comprised of source and drain regions that are formed in an active region surrounded by isolation material, typically silicon dioxide. The gate structure ("gate") of the device is formed above the active region and one or more sidewall spacers are formed adjacent the gate structure using a variety of known processing techniques. Typically the spacers are formed by conformably depositing a layer of spacer material, e.g., silicon nitride, and thereafter performing an anisotropic etching process. Note that the spacer is formed around the entire perimeter of the gate structure and that the spacer is formed with the intent that it has a substantially uniform thickness at all locations around the perimeter of the gate structure.

The present disclosure is directed to various methods of forming a semiconductor device using a layer of material having a plurality of trenches formed therein and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a semiconductor device using a layer of material having a plurality of trenches formed therein and the resulting semiconductor device. One illustrative method disclosed includes, among other things, forming a layer of material above at least an entire active region of a semiconductor substrate, forming a plurality of laterally spaced-apart source/drain trenches in the layer of material above the active region, performing at least one process operation through the spaced-apart source/drain trenches to form doped source/drain regions of the device, after forming the doped source/drain regions of the device, forming a gate trench at least partially in the layer of material between the spaced-apart source/drain trenches in the layer of material, wherein portions of the layer of material remain positioned between the source/drain trenches and the gate trench, forming a gate structure within the gate trench and forming a gate cap layer above the gate structure positioned within the gate trench.

Another illustrative method disclosed herein includes, among other things, forming a layer of material above at least an entire active region of a semiconductor substrate, forming a plurality of laterally spaced-apart source/drain trenches in the layer of material above the active region, performing at least one process operation through the spaced-apart source/drain trenches to form doped source/drain regions of the device, after forming the doped source/drain regions of the device, forming a gate trench at least partially in the layer of material between the spaced-apart source/drain trenches in the layer of material, wherein portions of the layer of material remain positioned between the source/drain trenches and the gate trench, forming a gate structure within the gate trench, forming a gate cap layer above the gate structure positioned within the gate trench and forming a conductive source/drain contact structure within each of the source/drain trenches after forming the gate cap layer.

Yet another illustrative method disclosed herein includes, among other things, forming a layer of material above at least an entire active region of a semiconductor substrate, forming a plurality of laterally spaced-apart source/drain trenches in the layer of material above the active region, performing at least one process operation through the spaced-apart source/drain trenches to form doped source/drain regions of the device, after forming the doped source/drain regions of the device, forming a conductive source/drain contact structure within each of the source/drain trenches, after forming the conductive source/drain contact structures, forming a gate trench at least partially in the layer of material between the spaced-apart source/drain trenches in the layer of material, wherein portions of the layer of material remain positioned between the source/drain trenches and the gate trench, forming a gate structure within the gate trench and forming a gate cap layer above the gate structure positioned within the gate trench.

Yet another illustrative method disclosed herein includes, among other things, forming a layer of material above at least an entire active region of a semiconductor substrate, forming a plurality of laterally spaced-apart source/drain trenches in the layer of material above the active region, performing at least one process operation through the spaced-apart source/drain trenches to form doped source/drain regions of the device, forming a gate trench in the layer of material between the spaced-apart source/drain trenches in the layer of material, thereby defining remaining portions of the layer of material positioned above the active region between the source/drain trenches and the gate trench, wherein an upper surface of the remaining portions of the layer of material above the active region have substantially the same width in a gate-length direction of the device, forming a gate structure within the gate trench and forming a conductive source/drain contact structure within each of the source/drain trenches.

One illustrative device disclosed herein includes, among other things, an active region defined in a semiconductor substrate, a layer of material positioned above the substrate, a plurality of laterally spaced-apart source/drain trenches formed in the layer of material above the active region, a conductive source/drain contact structure formed within each of the source/drain trenches, a gate trench formed at least partially in the layer of material between the spaced-apart source/drain trenches in the layer of material, wherein portions of the layer of material remains positioned between the source/drain trenches and the gate trench, a gate structure positioned within the gate trench and a gate cap layer positioned above the gate structure.

Another illustrative device disclosed herein includes, among other things, an active region defined in a semiconductor substrate, a layer of material positioned above the substrate, a plurality of laterally spaced-apart source/drain trenches formed in the layer of material above the active region, a conductive source/drain contact structure formed within each of the source/drain trenches, a gate trench formed at least partially in the layer of material between the spaced-apart source/drain trenches in the layer of material, wherein first portions of the layer of material remain positioned between the source/drain trenches and the gate trench above the active region and second portions of the layer of material remain positioned between the source/drain trenches and the gate trench outside of the active region, wherein the second portions of the layer of material are thicker in a gate width direction of the device than are the first portions of the layer of material, and a gate structure positioned within the gate trench, wherein a first portion of the sidewalls of the gate structure are positioned adjacent the first portions of the layer of material and a second portion of the sidewalls of the gate structure are positioned adjacent the second portions of the layer of material.

BRIEF DESCRIPTION OF THE DRAWINGS

The disclosure may be understood by reference to the following description taken in conjunction with the accompanying drawings, in which like reference numerals identify like elements, and in which:

FIGS. 3A-3G depict yet another illustrative method disclosed herein of forming a semiconductor device using a layer of material having a plurality of trenches formed therein and the resulting semiconductor device; and FIGS. 4A-4C depict plan views of illustrative examples of the various devices disclosed herein.

Figure 1A:
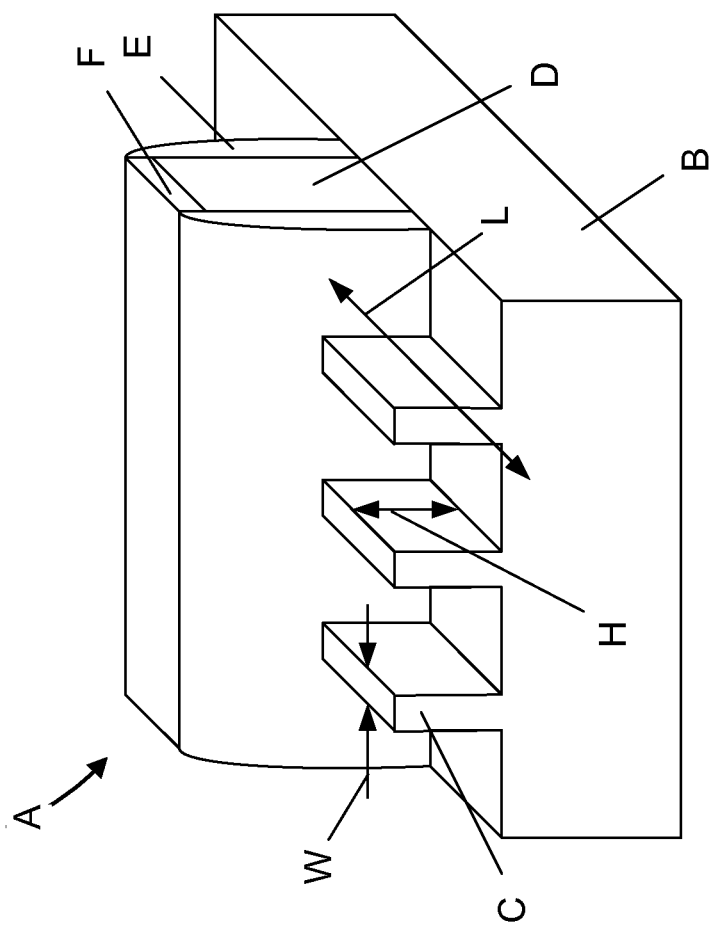
FIG. 1A is a perspective view of one illustrative embodiment of a prior art FinFET device.
Figure 1B:
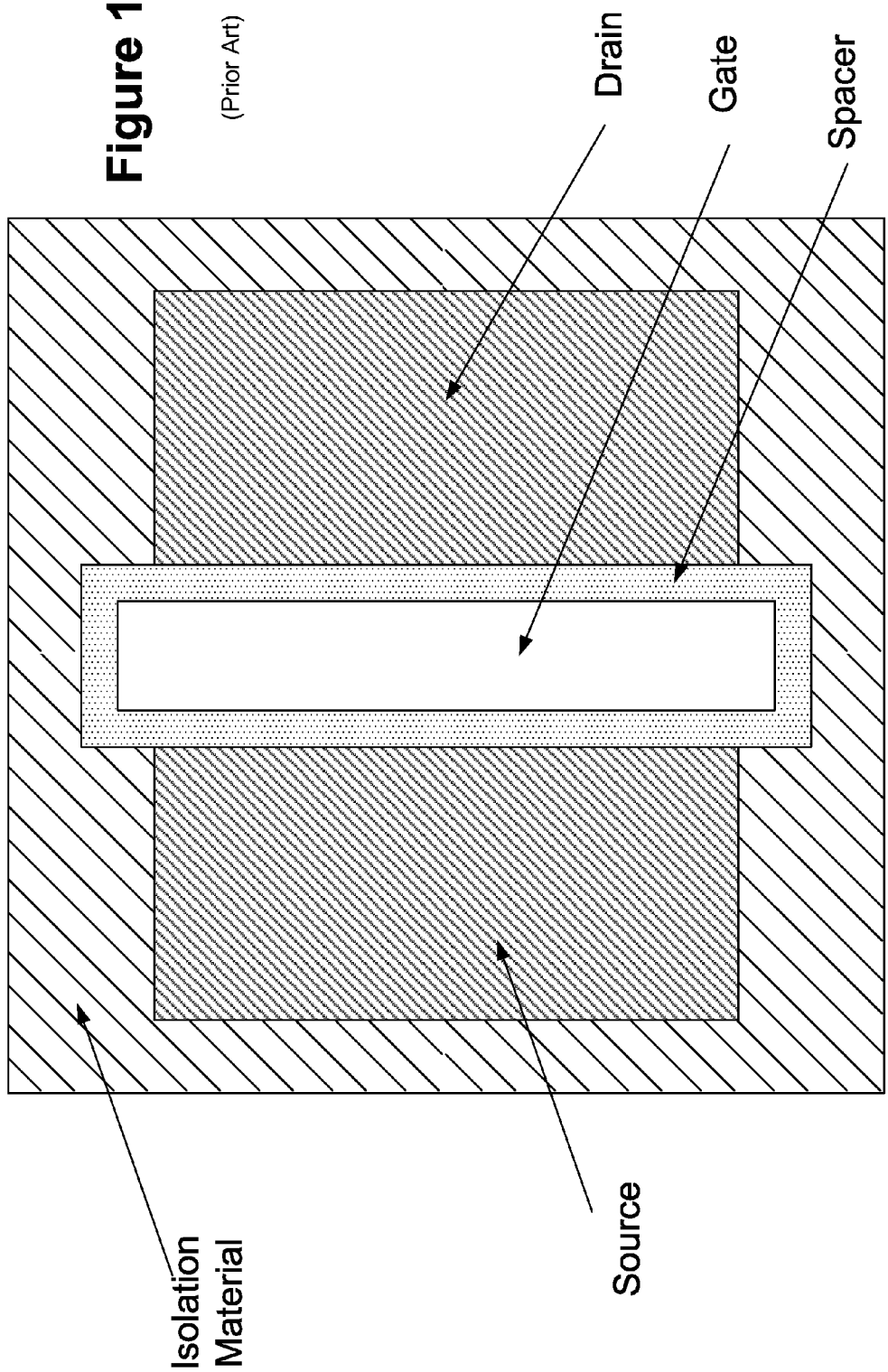
FIG. 1B is a plan view of an illustrative prior art transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a semiconductor device using a layer of material having a plurality of trenches formed therein and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. Thus, the terms "substrate" or "semiconductor substrate" should be understood to cover all semiconducting materials and all forms of such materials.

As will be appreciated by those skilled in the art after a complete reading of the present application, the methods and structures disclosed herein may be used when forming either planar or 3D transistor devices. An illustrative device 100 in the form of a 3D, FinFET device 100 will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

In general, the subsequent drawings contain a simplistic plan view and various cross-sectional views. As shown in a simplistic plan drawing shown in the upper right corner of FIG. 2A only, the view "X-X" is a cross-sectional view taken through the source/drain regions of the device 100 in the gate-width direction of the device 100, while the view "Y-Y" is a cross-sectional view that is taken through the long axis of the of an illustrative fin, i.e., a cross-sectional view along the long-axis of the fin through the gate structure in the gate-length direction (current transport direction) of the transistor device.

Figure 2A:
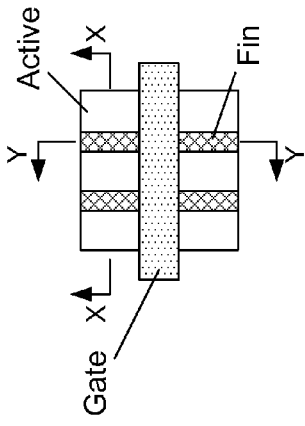
FIGS. 2A-2R depict one illustrative method disclosed herein of forming a semiconductor device using a layer of material having a plurality of trenches formed therein and the resulting semiconductor device.
Figure 2A:
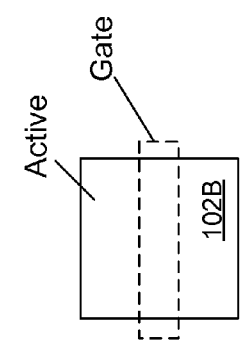
Figure 2A:
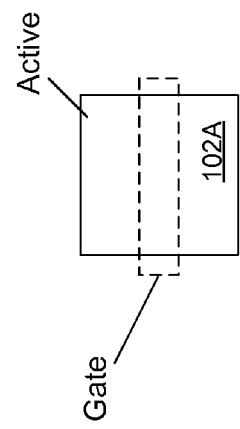
Figure 2A:
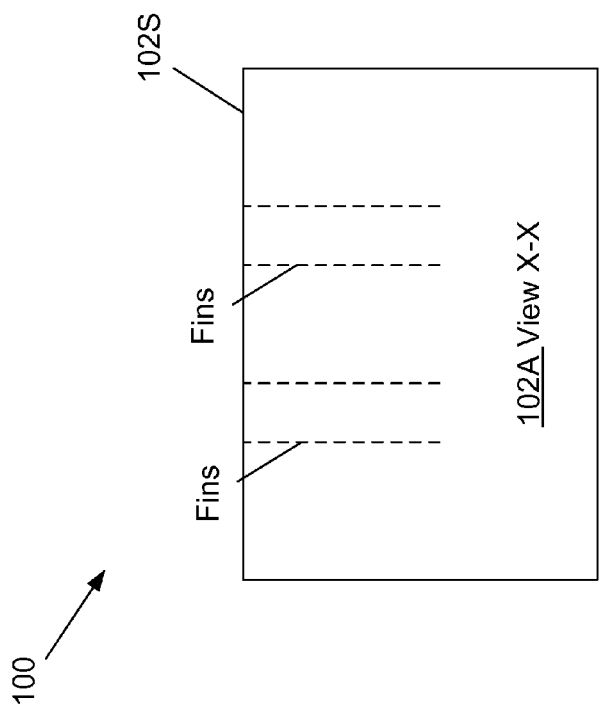

At the point in fabrication depicted in FIG. 2A, an isolation material (not shown) may be formed in the substrate 102 to define illustrative spaced-apart active regions 102A, 102B in the substrate 102. The spaced-apart active regions 102A-B are only depicted in the plan view in the following drawings, while the cross-sectional views depict the fabrication of an illustrative device that will be formed above each of the active regions 102A-B. The isolation regions may be formed using traditional techniques, e.g., traditional shallow trench isolation regions may be formed in the substrate 102. In the case of FinFET devices, the isolation regions may be formed before or after the formation of the fin structures that will be formed as described more fully below. At the point of fabrication depicted in FIG. 2A, the substrate 102 has an exposed upper surface 102S. For reference purposes only, the approximate location of the gate structure and fins for the device 100 are shown in dashed lines in FIG. 2A.

Figure 2B:
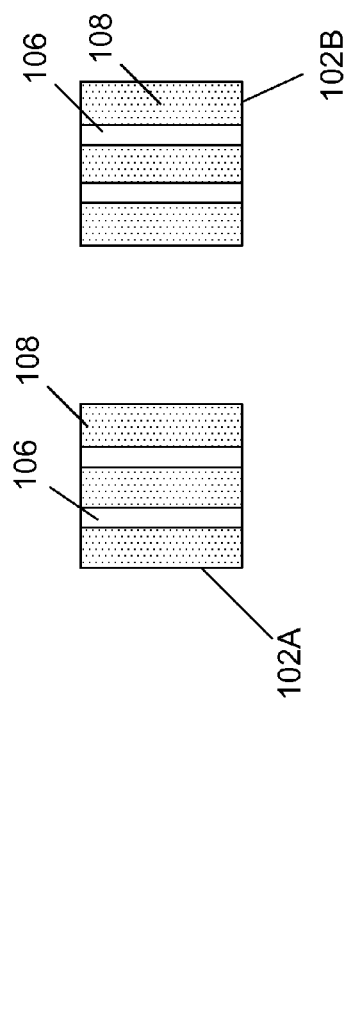
Figure 2B:
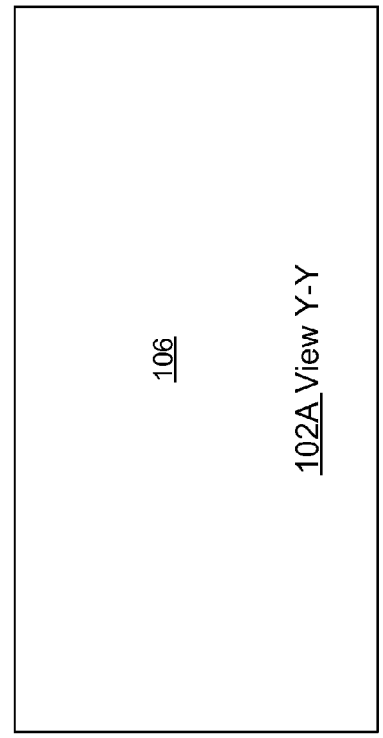
Figure 2B:
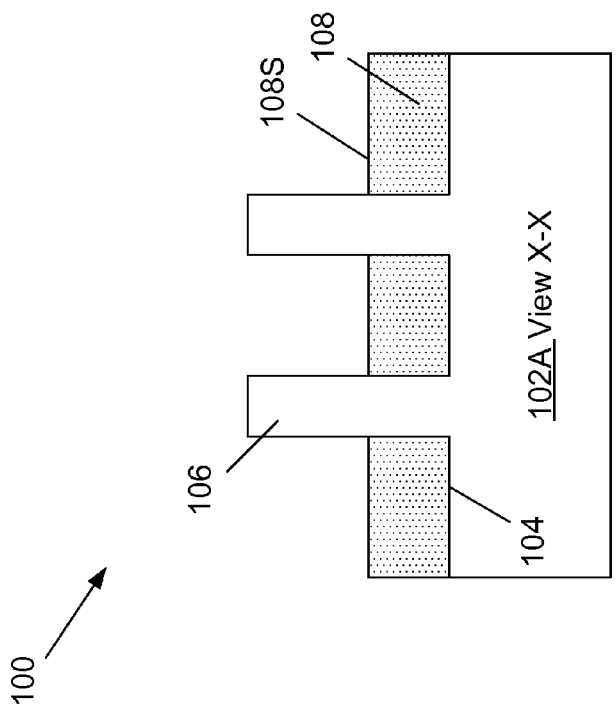

FIG. 2B depicts the device 100 after several additional process operations were performed. First, one or more etching processes, e.g., anisotropic etching processes, were performed through a patterned etch mask (not shown) to define a plurality of fin-formation trenches 104 in the substrate 102. The formation of the trenches 104 results in the formation of a plurality of initial fin structures 106. Thereafter, a recessed layer of insulating material 108, such as a layer of silicon dioxide, was formed in the trenches 104 between the fins 106. In one illustrative embodiment, the recessed layer of insulating material 108 may be formed by blanket depositing the initial layer of insulating material across the device so as to over-fill the trenches 104. Thereafter, an optional chemical mechanical polishing (CMP) process may be performed to planarize the upper surface of the layer of material 108. Then, a timed, recessing etch-back process may be performed on the layer of insulating material to recess the upper surface 108S of the layer of insulating material 108 to the desired height level, thereby exposing a desired amount of the fins 106 above the recessed surface 108S. The layer of material 108 may be comprised of a variety of different materials, such as silicon dioxide, etc., and it may be formed by performing a variety of techniques, e.g., chemical vapor deposition (CVD), etc.

The width and height of the fin structures 106 as well as the depth of the trenches 104 may vary depending upon the particular application. Additionally, the overall size, shape and configuration of the fin-formation trenches 104 and fins 106 may vary depending on the particular application. In the illustrative examples depicted in the attached drawings, the fin-formation trenches 104 and fins 106 are all depicted as having a uniform size and shape. However, such uniformity in the size and shape of the fin-formation trenches 104 and the fins 106 is not required to practice at least some aspects of the inventions disclosed herein. In the attached figures, the fin-formation trenches 104 are depicted as having been formed by performing an anisotropic etching process that results in the fin-formation trenches 104 having a schematically depicted, generally rectangular configuration. In an actual real-world device, the sidewalls of the fin-formation trenches 104 may be somewhat inwardly tapered, although that configuration is not depicted in the attached drawings. In some cases, the fin-formation trenches 104 may have a reentrant profile (not shown) near the bottom of the fin-formation trenches 104. To the extent the fin-formation trenches 104 are formed by performing a wet etching process, the fin-formation trenches 104 may tend to have a more rounded configuration or non-linear configuration as compared to the generally rectangular configuration of the fin-formation trenches 104 that are formed by performing an anisotropic etching process. Thus, the size and configuration of the fin-formation trenches 104, and the manner in which they are made, as well as the general configuration of the fins 106, should not be considered a limitation of the present invention. For ease of disclosure, only the substantially rectangular fin-formation trenches 104 and fins 106 will be depicted in the subsequent drawings. Moreover, the device 100 may be formed with any desired number of fins 106.

Figure 2C:
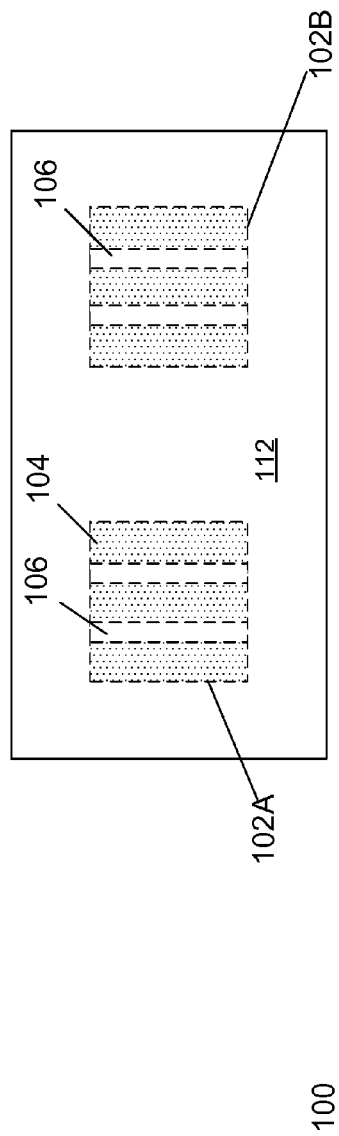
Figure 2C:
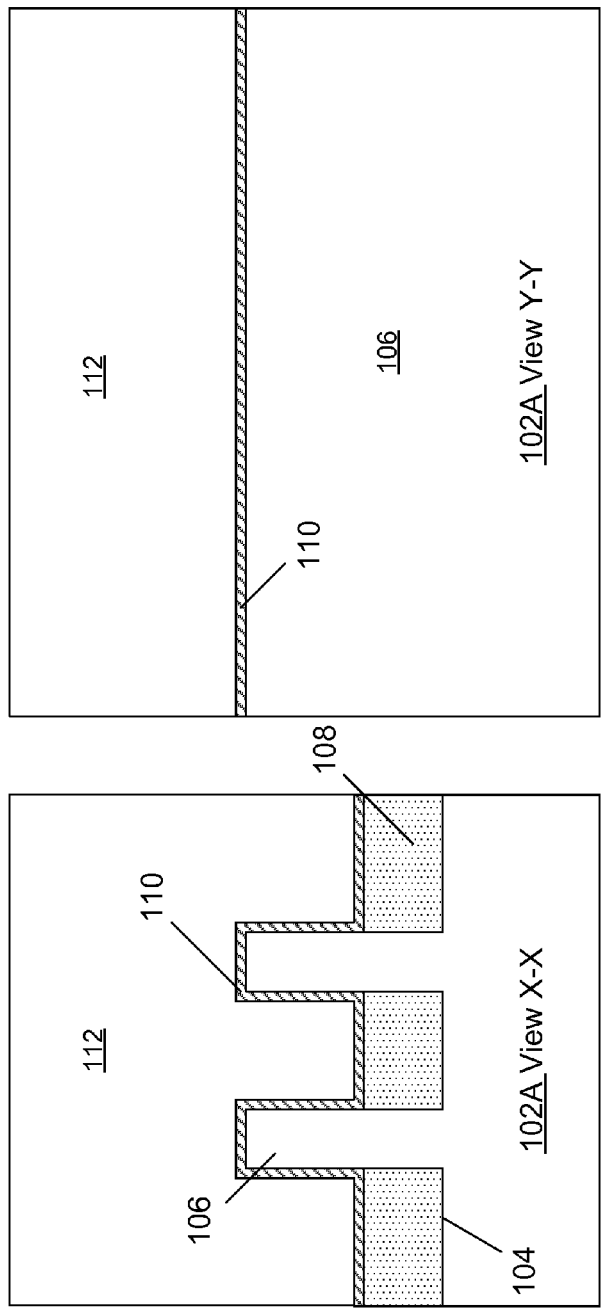

FIG. 2C depicts the device 100 after a conformal etch stop layer 110 was formed and after a layer of material 112 was blanket-deposited across the device 100. The material layer 112 may be comprised of a variety of different materials depending upon the particular application. In one illustrative embodiment, the material layer 112 may be comprised of a low-k silicon nitride material, such as silicon-carbon-boron-nitride ($SiB_xC_yN$), silicon nitride (SiN), a material having a dielectric constant less than or equal to 7, etc. The material layer 112 may be formed to any desired thickness. The etch stop layer 110 may be comprised of a variety of materials, such as silicon dioxide, hafnium oxide, etc.

Figure 2D:
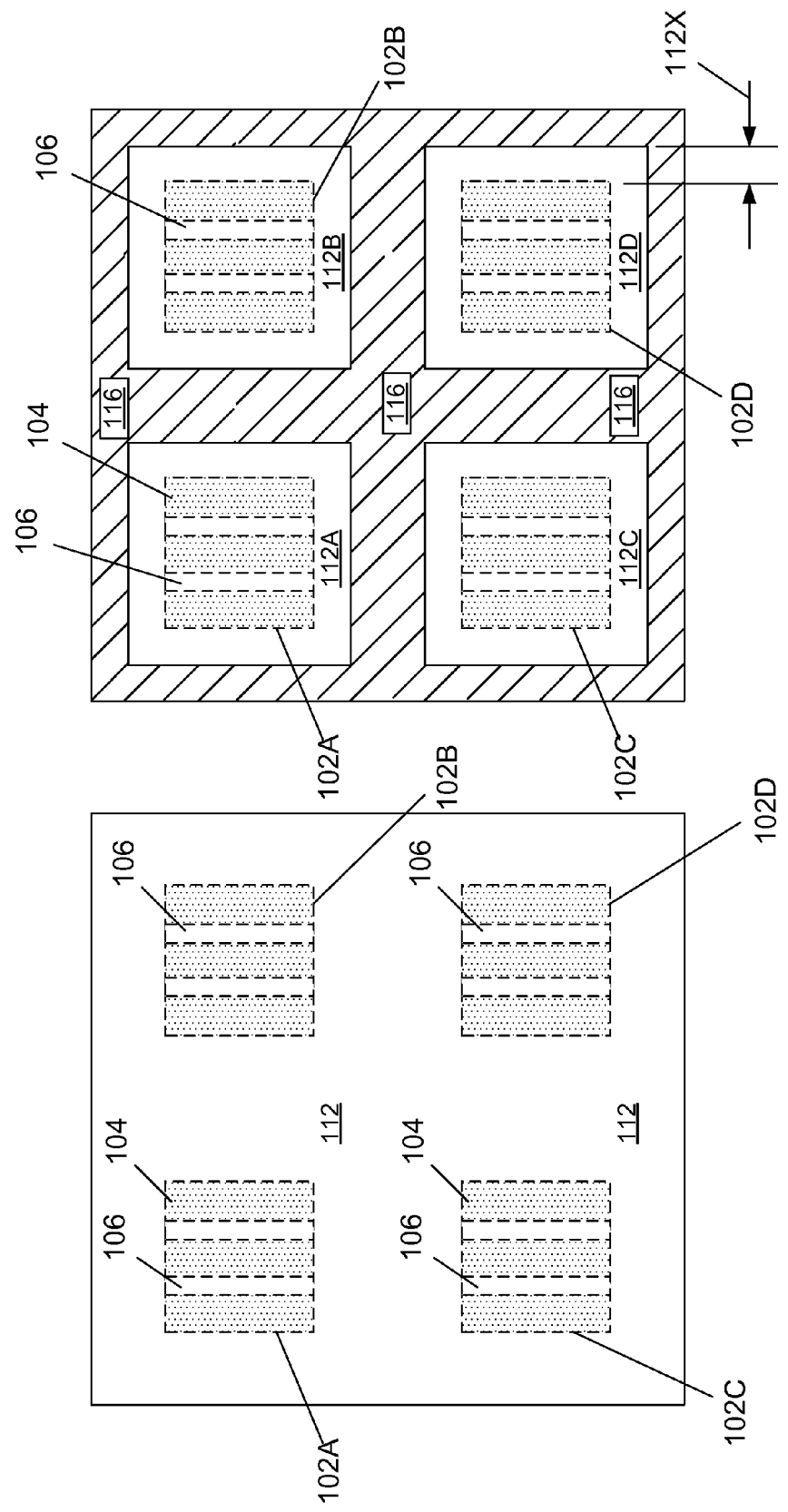

FIG. 2D is a plan view that is provided to explain how the material layer 112 may be formed in different applications. In the example depicted in the left-hand side in FIG. 2D, the material layer 112 is blanket-deposited above the entire surface of the substrate 102 so as to cover all of the active regions defined in the wafer, including the four illustrative spaced-apart active regions 102A-D depicted in the left side of FIG. 2D. In the example depicted in the right-hand side of FIG. 2D, the material layer 112 is formed into four illustrative and separate material layers 112A-D that are each positioned above spaced-apart active regions 102A-D, respectively. In the example depicted in the right-hand side of FIG. 2D, another layer of insulating material 116 is formed between the spaced-apart regions of the material layers 112A-D. For example, the layer of insulating material 116 may be comprised of a lower-k material or a higher-k material relative to the material of the material layer 112, if desired. The arrangement depicted in the right-hand side of FIG. 2D may be produced by depositing the layers of material 110, 112, performing one or more etching processes through a masking layer (not shown) to pattern that blanket-deposited layer of material 112, and thereafter forming the layer of insulating material 116 in the trenches defined between the spaced-apart regions of material layer 112A-D. In the case of the latter application, the spaced-apart regions of material layer 112A-D should be of a size such that they extend beyond the edge of the underlying active regions by a distance 112X of about 3-10 nm. Of course, the active regions 102A-D need not have a square configuration when viewed from above, i.e., they may have a rectangular configuration. The remaining drawings will be based upon the embodiment where the material layer 112 is formed as depicted in the left-hand side in FIG. 2D.

Figure 2E:
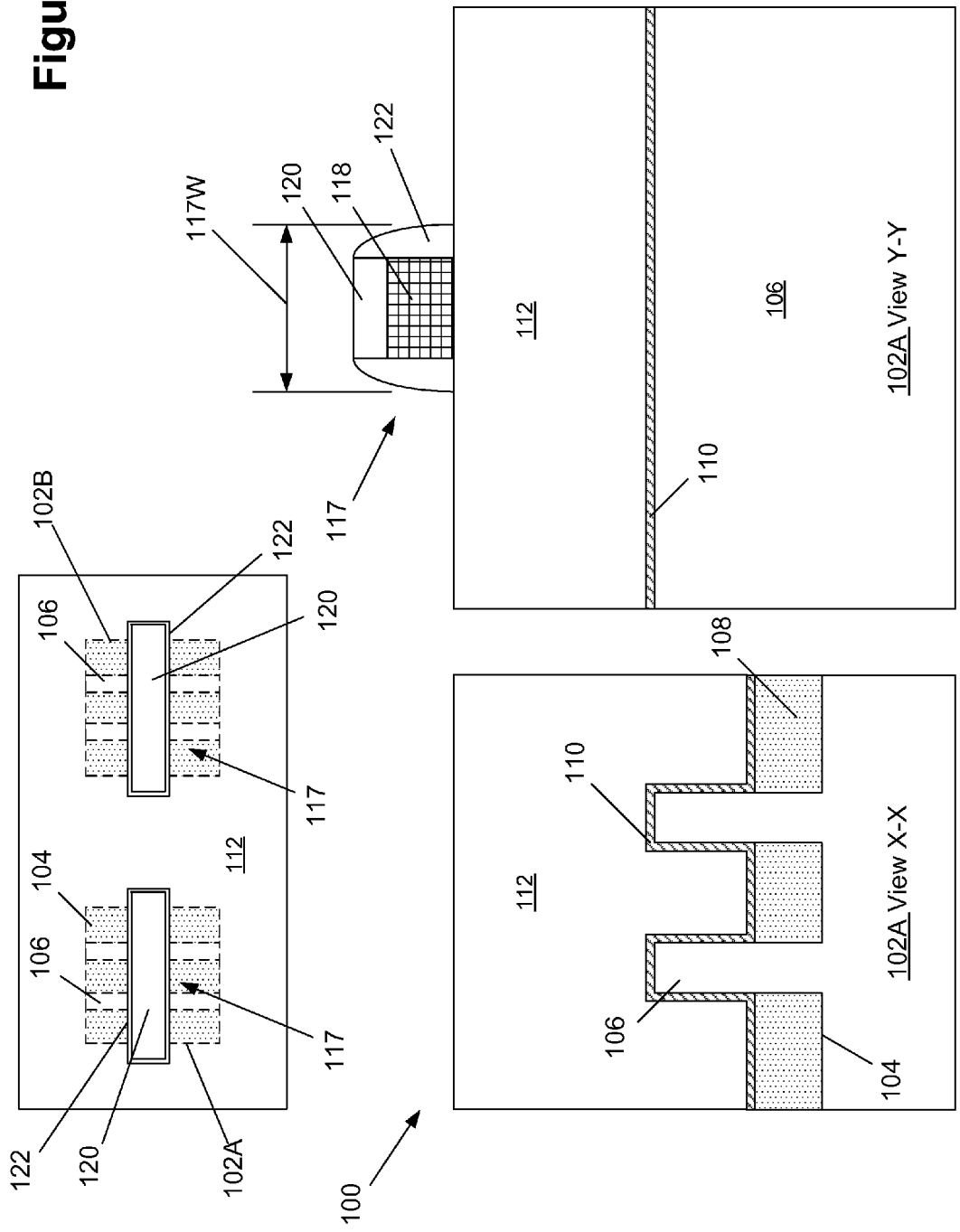

FIG. 2E depicts the device after several process operations were performed. First, a gate mask layer 117 was formed above the device 100. The gate mask layer 117 is generally comprised of a patterned sacrificial material 118 (e.g., amorphous silicon), sidewall spacers 122 (e.g., silicon nitride) and a gate cap layer 120 (e.g., silicon dioxide). The gate mask layer 117 depicted in FIG. 2E was formed by blanket-depositing the layer of sacrificial material 118, blanket-depositing material corresponding to the gate cap layer 120 and, thereafter, performing one or more anisotropic etching processes through a patterned etch mask (not shown) to define the patterned layer of sacrificial material 118 with the patterned cap layer 120 positioned thereabove. Next, the spacers 122 were formed by conformably depositing a layer of spacer material and thereafter performing an anisotropic etching process to define the spacers 122. As will be appreciated by one skilled in the art after a complete reading of the present application, the gate mask layer 117 may have a lateral width 117W (in a direction corresponding to the gate length (current transport) direction of the device 100) that is equal to the target lateral width of the gate structure for the device 100 plus about two times the final desired width of the "spacers" for the device that will be positioned adjacent the gate structure and between the source/drain regions of the device. As will be clear from the discussion below, the "spacers" are actually part of the original material layer 112.

FIG. 2F depicts the device 100 after several additional process operations were performed. First, in one embodiment, a sacrificial material layer 124, e.g., amorphous silicon, was blanket-deposited across the entire device 100. Thereafter, a CMP process was performed to planarize the upper surface 124S of the sacrificial material layer 124 with the upper surface 120S of the cap layer 120.

Figure 2G:
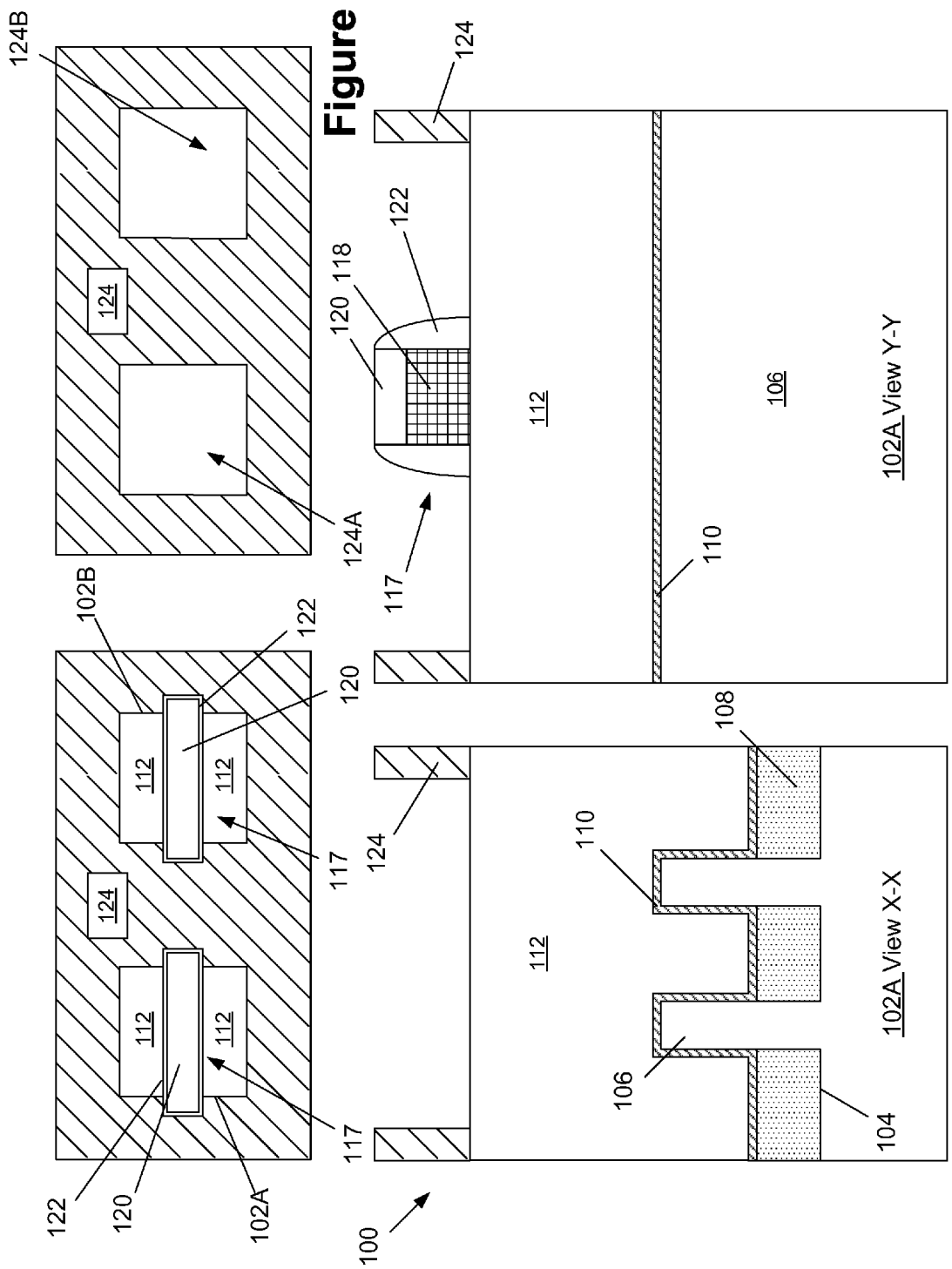

FIG. 2G depicts the device 100 after the sacrificial material layer 124 was patterned by performing an etching process through a patterned etch mask (not shown), e.g., a patterned photoresist etch mask, to define a plurality of openings 124A, 124B in the sacrificial material layer 124. In general, the openings 124A-B each have a configuration that corresponds to the configuration of the underlying active regions 102A-B (respectively) plus the portions of the gate mask layer 117 extending beyond the edge of the active regions. The plan view in the upper right portion of FIG. 2G is a plan view of only the sacrificial material layer 124 after it has been patterned. As depicted, this etching process exposes the material layer 112 that is positioned above what will become the source/drain regions of the device 100.

Figure 2H:
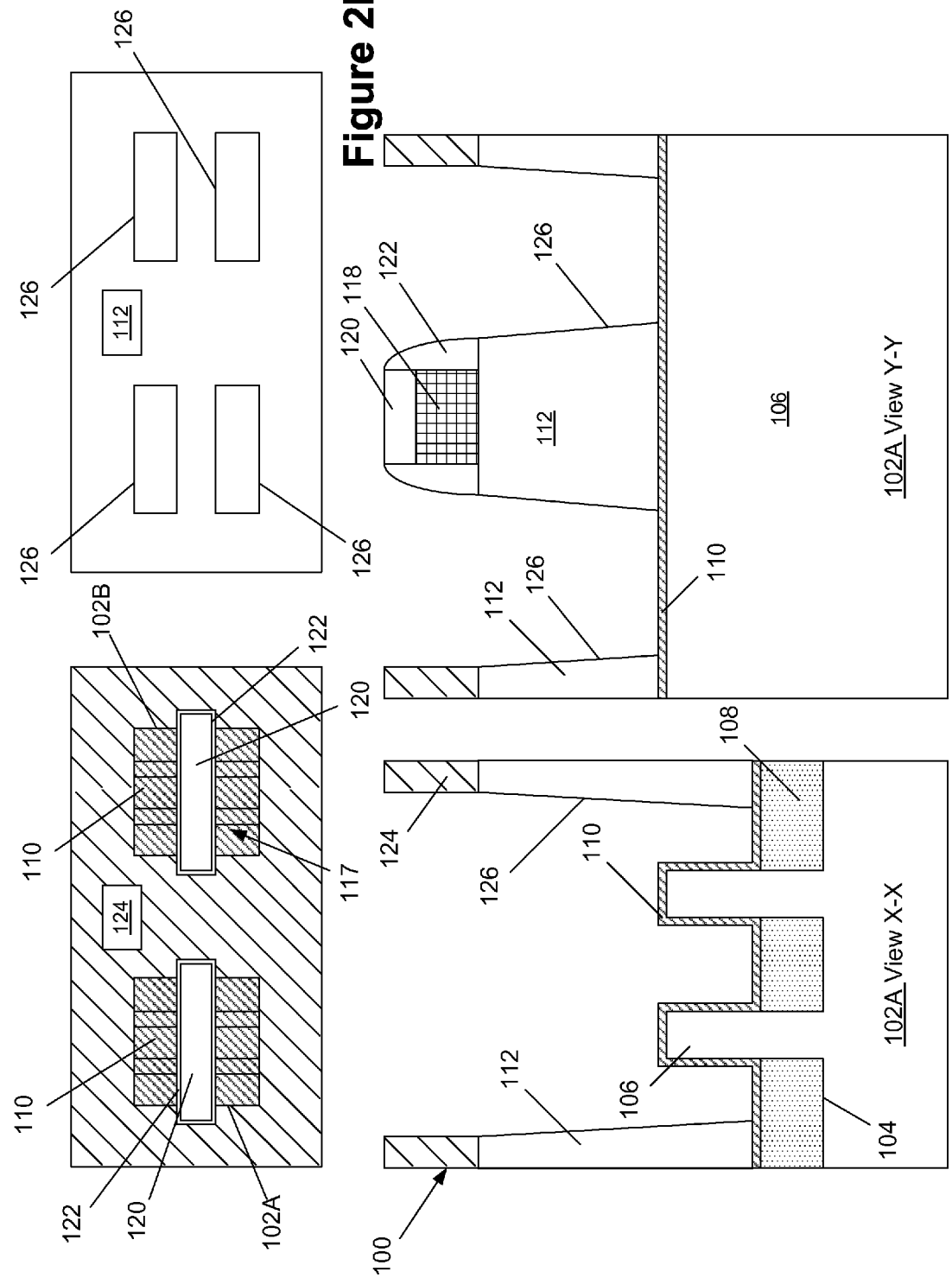

FIG. 2H depicts the device 100 after an anisotropic etching process was performed through the openings 124A-B in the patterned sacrificial material layer 124 to define source/drain openings or trenches 126 in the material layer 112. The etching process stops on the etch stop layer 110 and thereby exposes the etch stop layer 110 for further processing. This etching process is also selective relative to the spacers 122 and the gate cap layer 120. Note that, due to the nature of the anisotropic etching process, the sidewalls of the source/drain trenches 126 are inwardly tapered to some degree. The plan view in the upper right portion of FIG. 2H is a plan view of only the material layer 112 after the four illustrative source/drain trenches 126 have been formed that extend through the material layer 112. The underlying etch stop layer 110 is not shown in the upper right plan view.

FIG. 2I depicts the device 100 after the sacrificial material layer 124 was removed by performing a selective etching process relative to the surrounding materials.

Figure 2J:
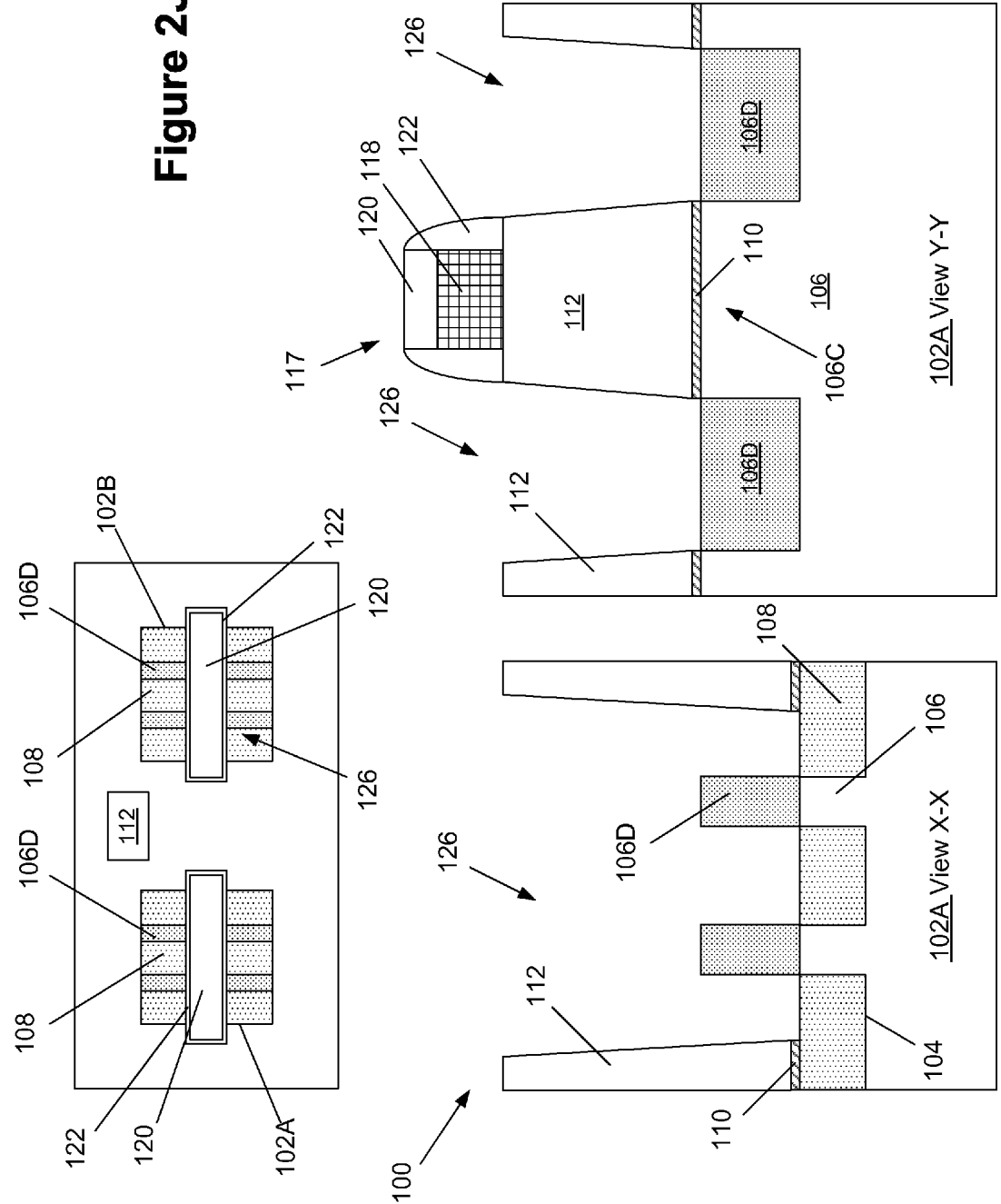

FIG. 2J depicts the device 100 after several additional process operations were performed. First, the exposed portions of the etch stop layer 110 were removed by performing an etching process through the source/drain trenches 126 in the material layer 112. This etching process exposes the fins 106. The next process operation involves introducing dopant material, N-type or P-type, into the exposed portions of the active regions to thereby form source/drain regions for the device 100. In one illustrative embodiment, a conformal doping process is performed to form heavily doped regions 106D in the portions of the fins 106 that are not covered by the material layer 112. As an example, the conformal doping process may be performed as described in a prior art paper entitled "Conformal Doping of FinFETs and Precise Controllable Shallow Doping for Planar FET Manufacturing by a Novel $B_2/H_6$/Helium Self-Regulatory Plasma Doping Process," by Sasaki et. al., which is hereby incorporated by reference in its entirety. After the dopants are introduced into the fins 106, a heat treatment process is performed to activate the dopant materials and to repair any damage to the lattice structure of the fins 106. In one illustrative embodiment, such a heat treatment process may be a rapid thermal anneal process performed at a temperature that falls within the range of about 900-1050° C. for a duration of about 5-60 seconds. Note that, during this heat treatment process, the dopant materials will migrate toward what will become the channel region 106C of the device, although such dopant migration is not depicted in the attached drawings. Alternatively, instead of performing the above-described conformal doping process, epi semiconductor material may be formed on the fins (either recessed or not recessed) in the source/drain regions. The epi material may be doped in situ or it may be doped by performing a later ion implantation process.

FIG. 2K depicts the device 100 after an optional layer of epi semiconductor material 128, e.g., epi silicon, was formed on the fins 106 within the source/drain trenches 126. The thickness of the epi material 128 may vary depending on the particular application. Note that, since the epi material 128 is formed within the confined space defined by the source/drain trenches 126, the epi material 128 will not grow into undesired locations, as was an issue when using prior art manufacturing techniques. For example, by forming the epi material 128 in the source/drain trenches 126, the epi material 128 will not grow and contact epi material grown on adjacent active regions. Of course, the epi material 128 need not be formed in all applications. If desired, metal silicide regions (not shown) may be formed on top of the epi material 128 or the fins 106 (if the epi material 128 is not formed) at this point in the process flow using traditional manufacturing techniques.

With continuing reference to FIG. 2K, the next process operation involves formation of a conformal sacrificial etch stop layer 130 and another sacrificial material layer 132 (formed by blanket-deposition) above the device 100. Thereafter, a CMP process was performed to planarize the upper surface of the sacrificial material layer 132 with the upper surface 120S of the cap layer 120. The sacrificial etch stop layer 130 may be comprised of a variety of materials, such as silicon dioxide, hafnium oxide, etc. The sacrificial material layer 132 may also be comprised of a variety of different materials, e.g., amorphous silicon, polysilicon, etc. Note that no attempt has been made to show the sacrificial etch stop layer 130 in the simplistic plan view drawings.

FIG. 2L depicts the device 100 after several process operations were performed. First, the sacrificial layer 132 was recessed such that its upper surface is positioned below the upper surface 112U of the material layer 112. Then, another layer of sacrificial material 134, e.g., silicon dioxide, was blanket-deposited across the device 100. Next, one or more CMP processes were performed to planarize the upper surface of the sacrificial material 134 and thereby remove the cap layer 120 and expose the upper surface 118U of the sacrificial material 118 of the gate mask layer 117.

FIG. 2M depicts the device 100 after the sacrificial material 118 was removed by performing an etching process. This etching process exposes the material layer 112 in the area between the spacers 122.

Figure 2N:
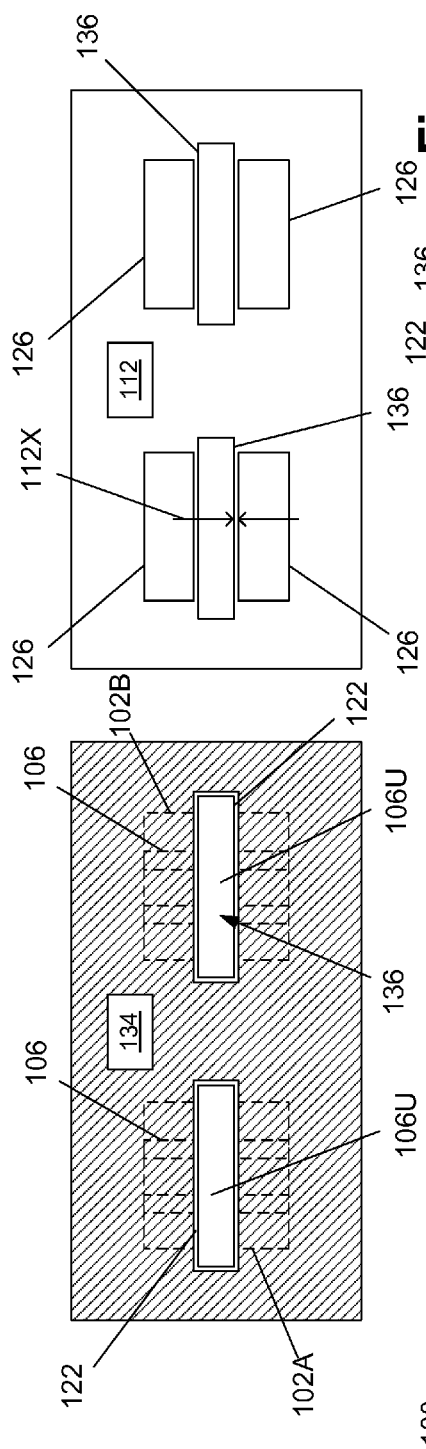
Figure 2N:
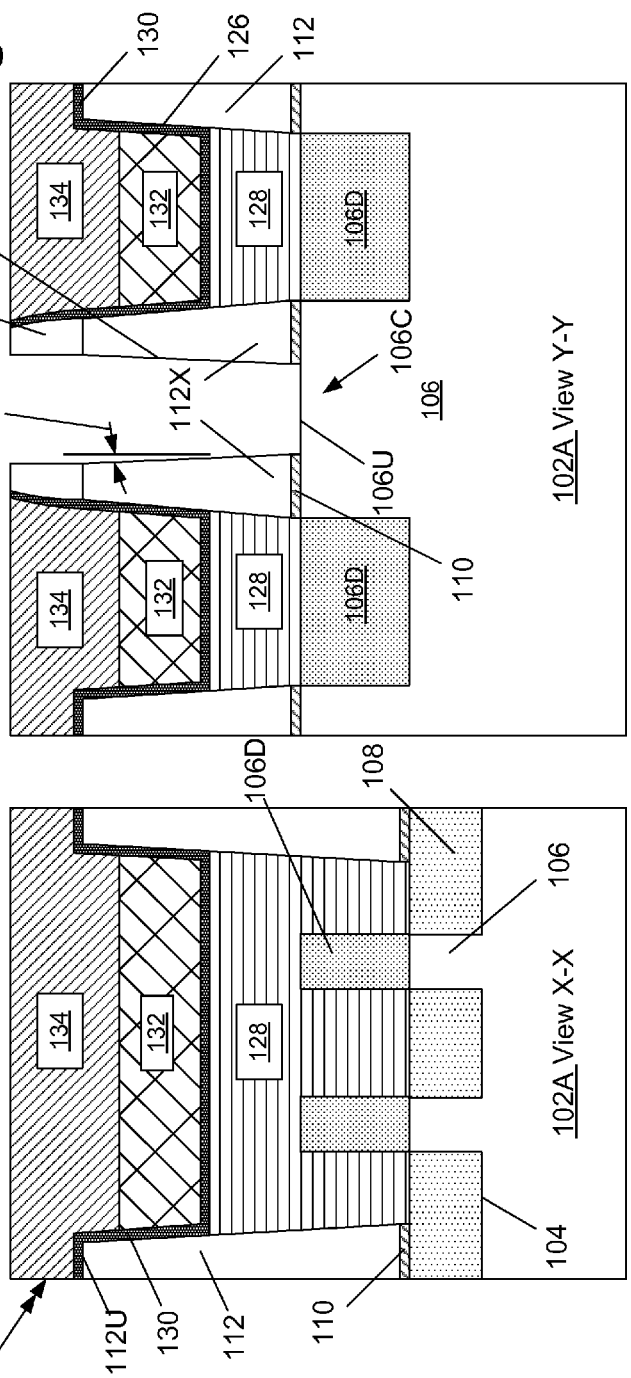

FIG. 2N depicts the device 100 after several process operations were performed. First, an anisotropic etching process was performed through the opening between the spacers 122 of the gate mask 117 to define gate trenches 136 in the material layer 112. The anisotropic etching process stops on the etch stop layer 110 and thereby exposes the etch stop layer 110 for further processing. Next, the exposed portions of the etch stop layer 110 were removed by performing an etching process. The removal of the etch stop layer 110 exposes an upper surface 106U of the fin 106 within the gate trench 136 in an area that will become the channel region 106C of the device 100. Note that, due to the nature of the anisotropic etching process, the sidewalls of the gate trenches 136 are inwardly tapered to some degree, as reflected by the angle 138, which may be about 89-86 degrees. The tapered sidewalls of the gate trench 136 will make the formation of the gate structure for the device easier and reduce the chances of the formation of undesirable voids in the gate structure. The plan view in the upper right portion of FIG. 2N is a plan view of only the material layer 112 after the four illustrative source/drain trenches 126 and the two illustrative gate trenches 136 have been formed that extend through the material layer 112. The underlying materials exposed by these trenches 126, 136 are not shown in the upper right plan view. The remaining portions 112X of the material layer 112 positioned between the source/drain trenches 126 and the gate trench 136 will serve as insulating "spacer" material between the yet to be formed gate structure for the device 100 and the source/drain epi material 128 (if formed) and the conductive source/drain contacts that will be formed for the device 100, as discussed more fully below. In one illustrative embodiment, the thickness of the material 112X at the top surface of the material 112X may be about 5-15 nm. Note that using the methods disclosed herein, the spacers 112X will always have the same approximate thickness on both sides of the gate structure that will be formed in the gate trench 136. This occurs because the configuration is set by the formation of the sacrificial material 118 in the gate mask layer 117 and the fact that the source/drain trenches 126 were formed with the gate mask layer 117 acting as an etch mask.

Of course, in the example wherein separate material layers 112 are each positioned above a single active region, as depicted in the right-hand side of FIG. 2D, the gate trench 136 may be formed in both material layer 112 and the layer of insulating material 116 that was formed between the spaced-apart regions of the material layer 112. In such a situation, almost all of the long sidewalls of the gate trench 136 are defined by the material layer 112, while the insulation material 116 defines the remaining walls of the gate trench 136. Thus, as used herein and in the claims, the term "gate trench" should be understood to be a trench that has almost all of at least the long sidewalls of the trench defined by the material layer 112. Of course, in some applications, all four walls of the gate trench 136 may be defined by the material layer 112.

Figure 2O:
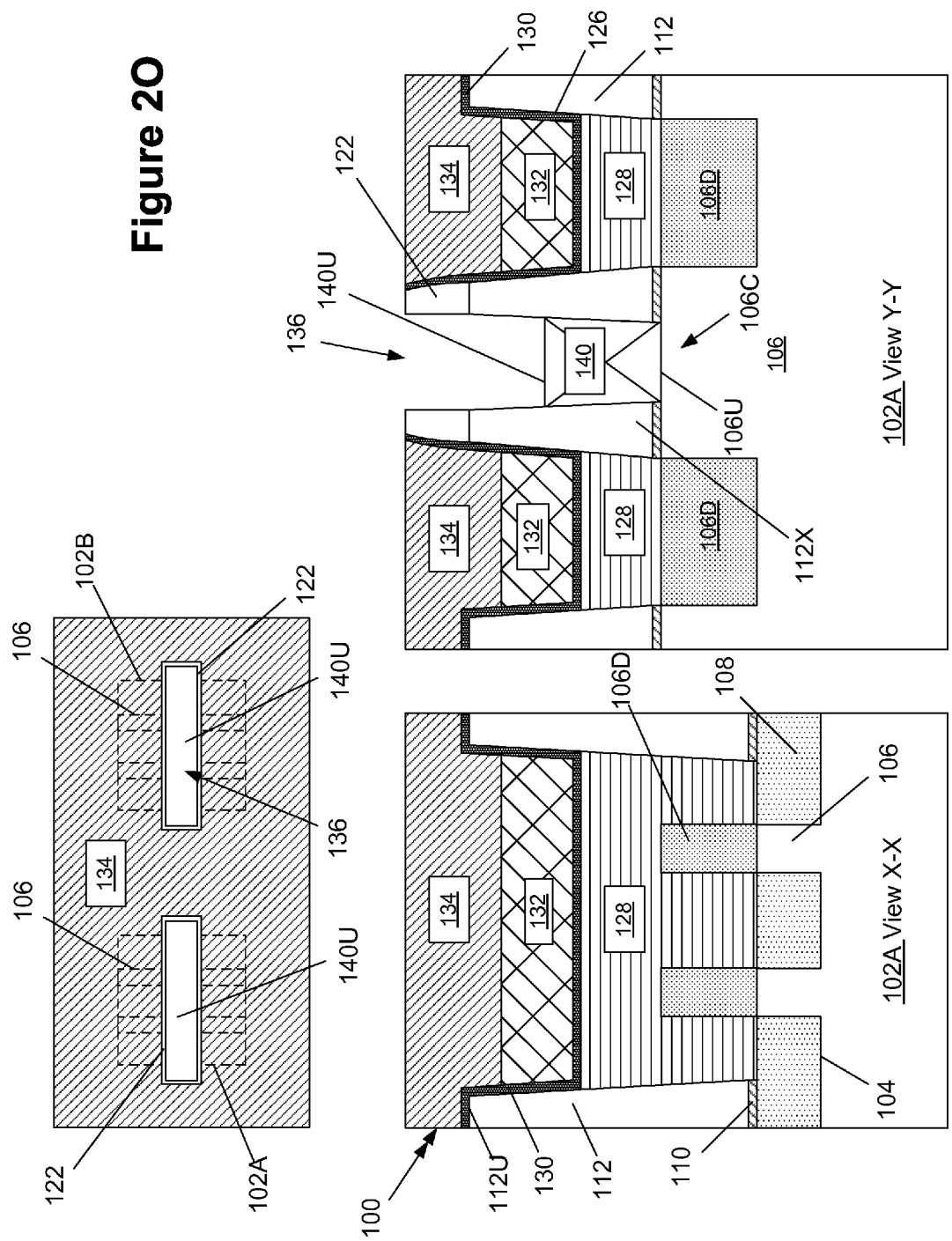

FIG. 2O depicts the device 100 after an illustrative and schematically depicted gate structure 140 was formed in the gate trench 136. The gate structure 140 depicted herein is intended to be representative in nature of any type of gate structure that may be employed in manufacturing integrated circuit products. Typically, a pre-clean process will be performed in an attempt to remove all foreign materials from within the gate trench 136 prior to forming the various layers of material that will become part of the gate structure 140. For example, the gate structure 140 may be formed by sequentially depositing the materials of the gate structure in the gate trench 136 and above the layer of material 134, performing a CMP process to remove excess materials above the layer 134 and then performing an etch-back recess etching process such that the upper surface 140U of the gate structure 140 is at the desired height level. As a specific example, a high-k (k value greater than 10) gate insulation layer (not individually shown), such as hafnium oxide, may be deposited across the device 100 and within the gate trench 136 on the portion of the fin 106 exposed by the gate trench 136 by performing a conformal deposition process, i.e., an ALD or CVD deposition process. If desired, a thin interfacial layer of silicon dioxide (not shown) may be formed prior to the formation of the high-k gate insulation layer. Next, at least one work function adjusting metal layer (not separately shown) (e.g., a layer of titanium nitride or TiAlC depending upon the type of transistor device being manufactured) may be deposited on the high-k gate insulation layer and within the gate trench 136 by performing a conformal ALD or CVD deposition process. Of course, more than one layer of work function metal may be formed in the gate trench 136, depending upon the particular device under construction. Then, a bulk conductive material, such as tungsten or aluminum, may be deposited in the gate trench 136 above the work-function adjusting metal layer(s). Thereafter, one or more CMP processes were performed to remove excess portions of the various layers of materiel positioned above the surface of the sacrificial material layer 134. Next, a recess etching process was performed so as to remove a desired amount of the materials of the gate structure 140 such that the upper surface 140U of the gate structure 140 is at the desired height level within the gate trench 136. Other possible materials for the gate insulation layer in the gate stack include, but are not limited to, tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Other possible materials for the work-function adjusting metal layers include, but are not limited to, titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

Figure 2P:
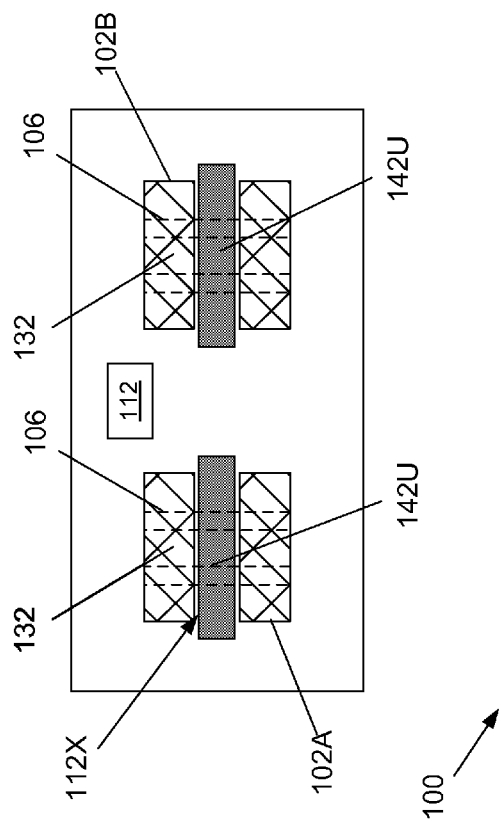
Figure 2P:
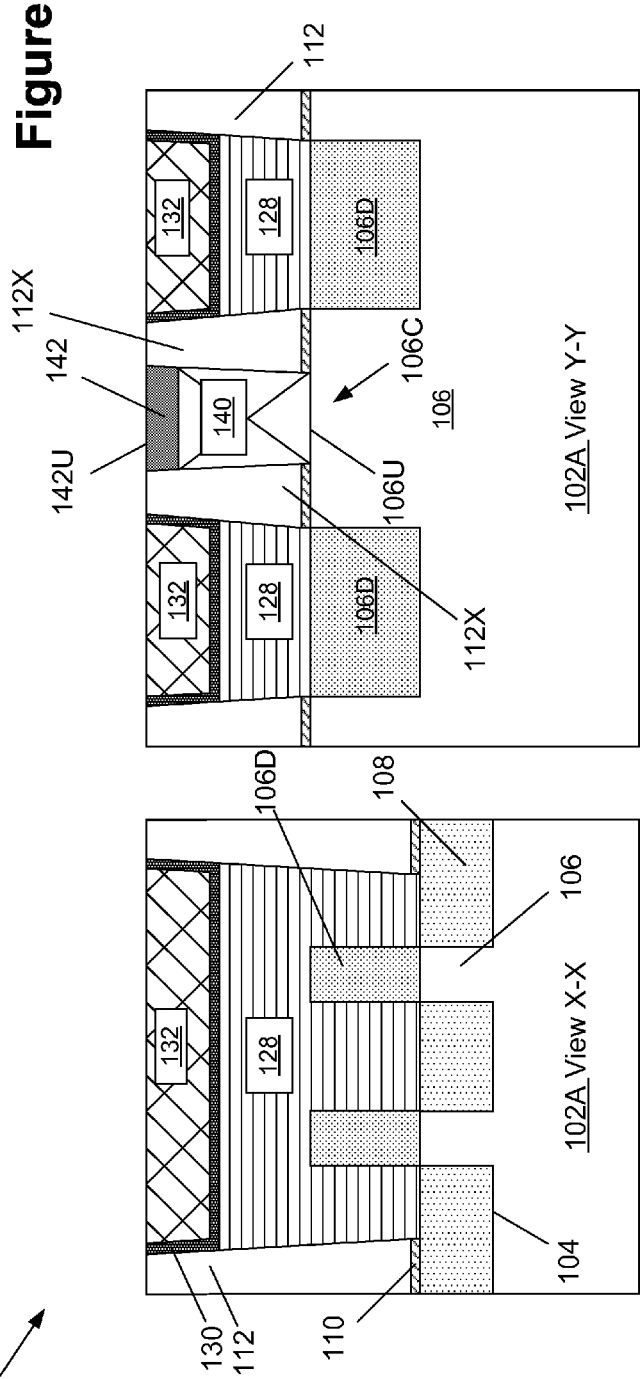

FIG. 2P depicts the device 100 after an illustrative gate cap layer 142 was formed in gate trench 136 above the recessed gate structure 140. The gate cap layer 142 may be formed from a variety of different materials, e.g., typically silicon nitride. The gate cap layer 142 may be formed by depositing a layer of gate cap material so as to over-fill the recess in the gate trench 136 and between the spacers 122 above the gate structure 140 and, thereafter, performing one or more CMP processes to remove excess portions of the gate cap material layer positioned above the surface of the sacrificial material layer 132. This process operation also removes the sacrificial material layer 134. The gate cap layer 142 is formed so as to protect the underlying gate structure 140 during subsequent processing operations.

Figure 2Q:
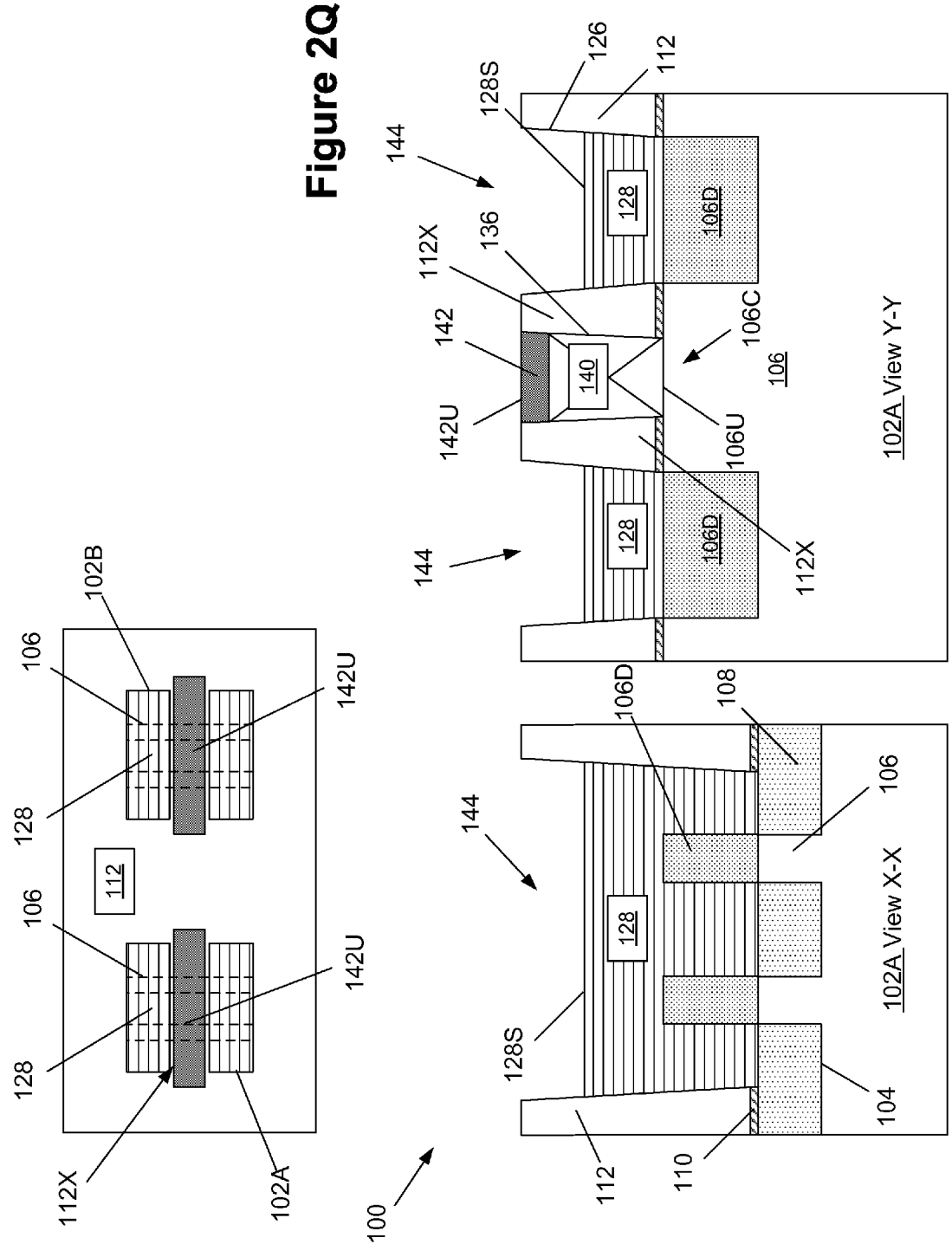

Next, as shown in FIG. 2Q, one or more etching processes were performed to remove the sacrificial materials 132, 130 from within the source/drain trenches 126. In the depicted example, these process operations expose the upper surface 128S of the epi material 128 and define a plurality of source/drain contact openings 144 in the material layer 112 within the source/drain trenches 126. If the epi material 128 is not formed, these process operations would expose the fins 106 within the source/drain trenches 126.

Figure 2R:
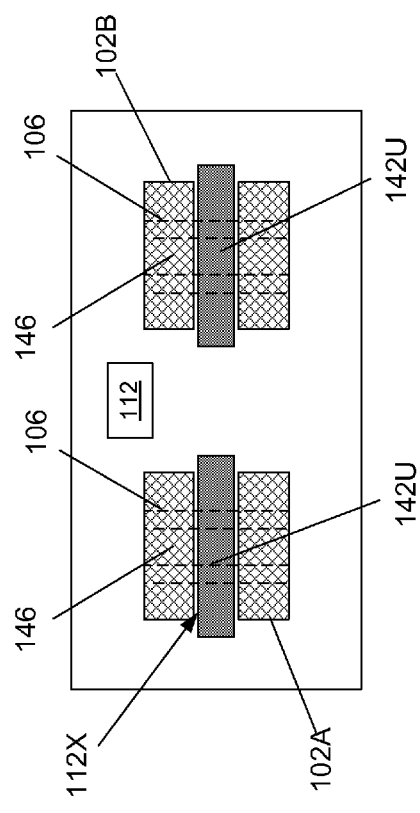
Figure 2R:
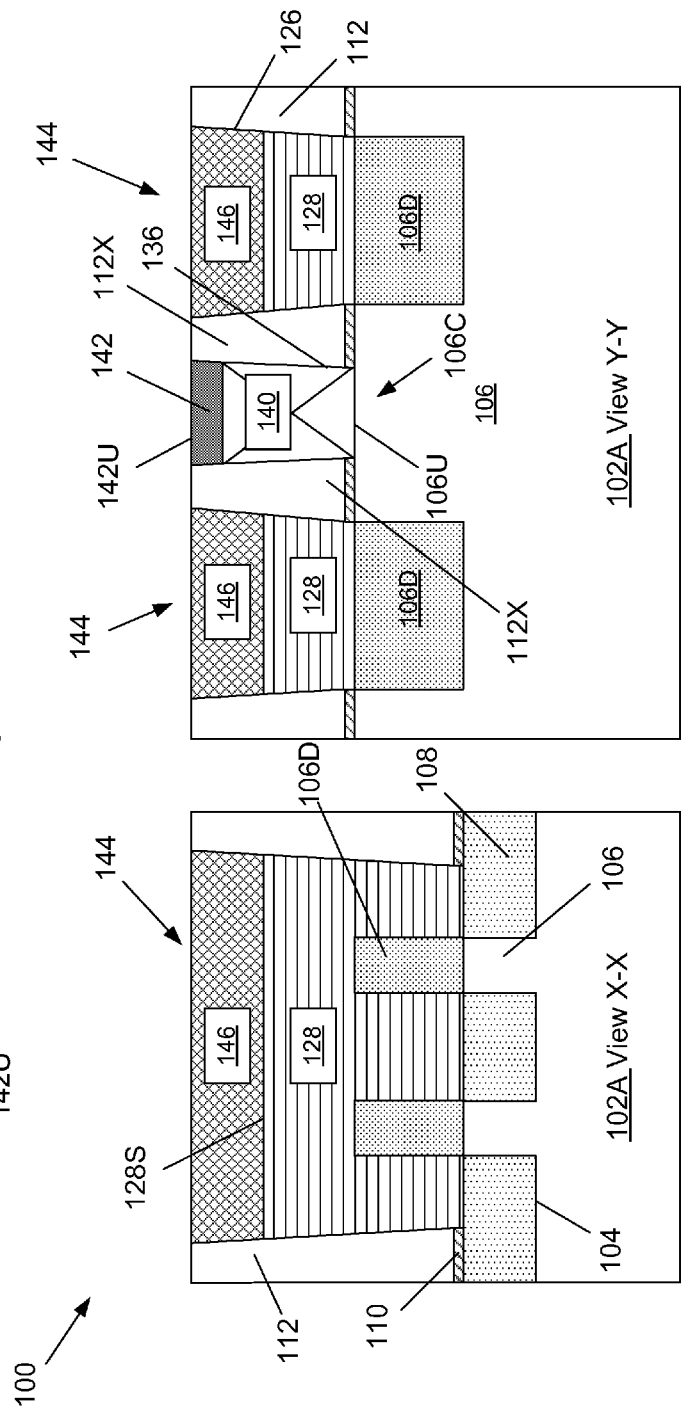

FIG. 2R depicts the device 100 after several process operations were performed to form schematically depicted conductive source/drain contacts 146 in the contact openings 144 within the source/drain trenches 126. Typically, the formation of such conductive structures 146 involves the formation of some form of metal silicide (not shown) and one or more conformal, conductive barrier or liner layers (not shown) in the contact openings 144. Thereafter, a bulk conductive material layer, such as tungsten or aluminum, is blanket-deposited above the substrate so as to over-fill the contact openings 144. Thereafter, a CMP process was performed to remove excess portions of the conductive materials positioned above the surface of the material layer 112 using the gate cap layer 142 as a polish stop layer. These operations result in the formation of the conductive structures 146 depicted in FIG. 2R that are conductively coupled to the source/drain regions formed in the fins 106. At this point in the process flow, traditional manufacturing processes may be performed to complete the fabrication of the device, e.g., formation of various metallization layers, etc.

FIGS. 3A-3G depict yet another illustrative method of forming a semiconductor device using a layer of material having a plurality of trenches formed therein and the resulting semiconductor device. Relative to the previous embodiment discussed above, in this embodiment, there is no epi material 128 formed in the source/drain regions of the device, and the conductive source/drain contacts 146 are formed within the source/drain trenches 126 prior to forming the gate trench 136 in the material layer 112.

FIG. 3A depicts the device 100 at a point that corresponds to that depicted in FIG. 2J, i.e., after the doped regions 106D have been formed in the portions of the active region that correspond to the source/drain regions of the device, i.e., in the fins 106 in the depicted example. As mentioned above, in this embodiment, no epi material 128 will be formed on the fins 106. As before, if desired, metal silicide regions (not shown) may be formed on the fins 106 at this point in the process flow. Additionally, and as before, unfilled portions of the source/drain trenches 126 constitute source/drain contact openings 144.

FIG. 3B depicts the device 100 after the above-described conductive source/drain contacts 146 were formed in the contact openings 144 within the source/drain trenches 126. Then, one or more CMP processes were performed to remove excess portions of the conductive materials positioned above the upper surface of the gate cap layer 120, i.e., the gate cap layer 120 was used as a polish stop layer.

Figure 3C:
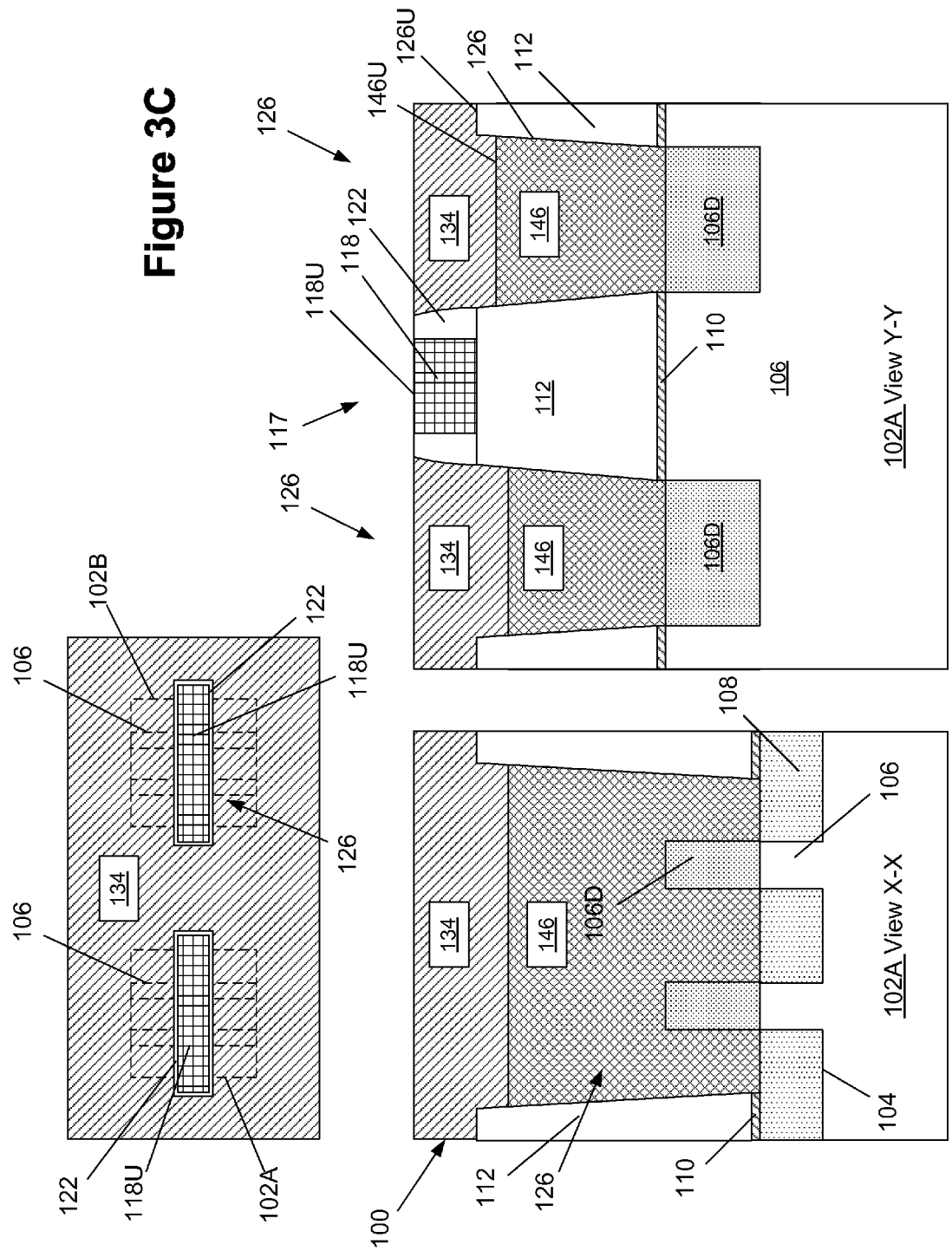

FIG. 3C depicts the device 100 after several process operations were performed. First, a recess etching process was performed so as to recess the upper surface 146U of the conductive source/drain contacts 146 below the upper surface 126U of the source/drain trenches 126. Next, the above-described sacrificial material layer 134 was blanket-deposited above the device and one or more CMP processes were performed to remove the cap layer 120 and expose the upper surface 118U of the sacrificial material 118 of the gate mask layer 117.

FIG. 3D depicts the device 100 after the sacrificial material 118 was removed by performing an etching process. This etching process exposes the material layer 112 in the area between the spacers 122.

Figure 3E:
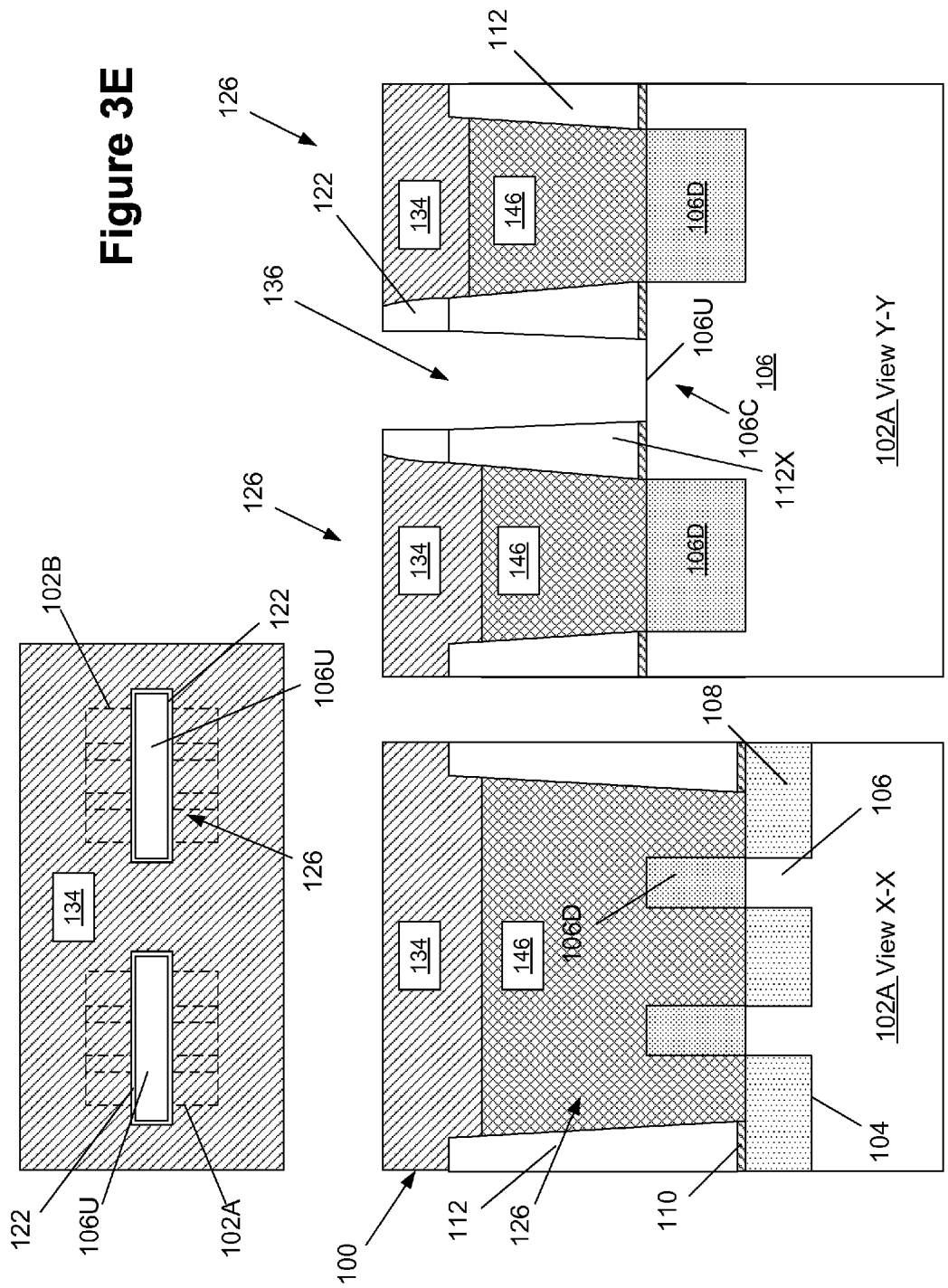

FIG. 3E depicts the device 100 after several process operations were performed. First, an anisotropic etching process was performed through the opening between the spacers 122 of the gate mask 117 to define the above-described gate trench 136 in the material layer 112. As before, this anisotropic etching process stops on the etch stop layer 110 and thereby exposes the etch stop layer 110 for further processing. Next, the exposed portions of the etch stop layer 110 were removed by performing an etching process. The removal of the etch stop layer 110 exposes the upper surface 106U of the fin 106 within the gate trench 136 in an area that will become the channel region 106C of the device 100. As before, the remaining portions 112X of the material layer 112 positioned between the source/drain trenches 126 and the gate trench 136 will serve as insulating "spacer" material between the yet to be formed gate structure for the device 100 and the conductive source/drain contacts 146.

FIG. 3F depicts the device 100 after the above-described gate structure 140 was formed in the gate trench 136.

Figure 3G:
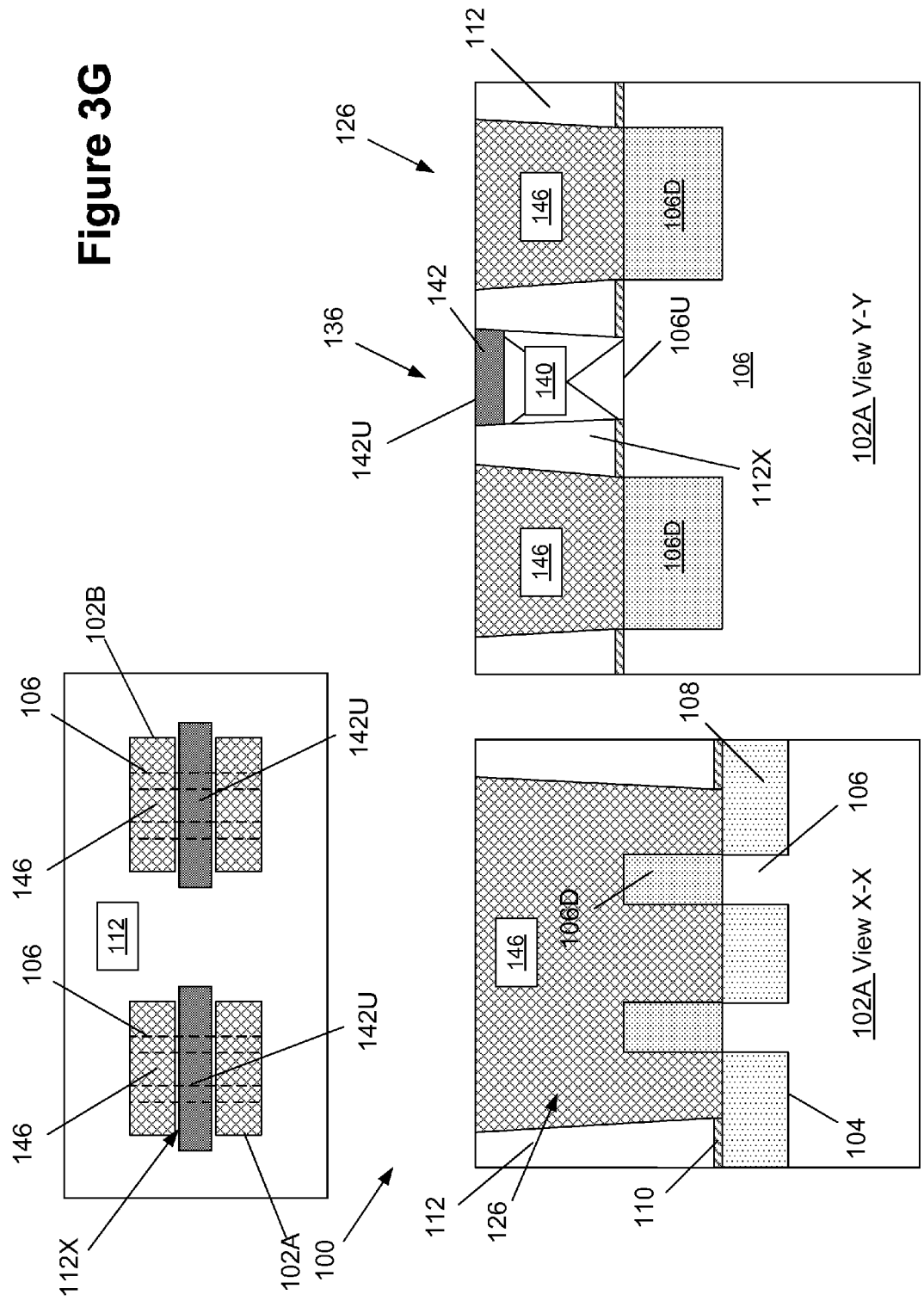

FIG. 3G depicts the device 100 after the above-described gate cap layer 142 was formed in the gate trench 136 above the recessed gate structure 140. The sacrificial material layer 134 was also removed during the CMP processes that were performed to form the gate cap layer 142. At this point in the process flow, traditional manufacturing processes may be performed to complete the fabrication of the device, e.g., formation of various metallization layers, etc.

FIGS. 4A-4C depict plan views of illustrative examples of the various devices disclosed herein. FIG. 4A is a plan view of the device 100 wherein the material layer 112 was formed across the entire wafer as depicted on the left-hand side of FIG. 2D. As can be seen in FIG. 4A, the "spacer" portions 112X of the material layer 112 have a substantially uniform thickness 112Y along the gate structure for the entire distance length 113 of the active region (in the gate width direction of the device) formed in the substrate. Given that the material layer 112 was, in this example, formed across the entire wafer, at locations where the gate structure extends beyond the active region, the gate structure is protected by larger or wider amounts of the material layer 112. For example, arbitrary dashed lines 115 have been added to FIG. 4A to indicate what is additional encapsulation material for the end regions of the gate structure that extend beyond the active region. This additional encapsulation material 115 is obviously thicker than the thickness 112Y of the "spacers" 112X positioned adjacent the longer sidewalls of the gate structure. With continuing reference to FIGS. 4A and 2R, the material layer 112 is a continuous layer of material having formed therein spaced-apart source and drain contact enclosure structures 131S, 131D, respectively, that each abut a sidewall of the gate structure 140 (via the spacer 112X) and laterally enclose at least a portion of their respective conductive source/drain contact structure 146 as well as gate enclosure structures 131G that abut and engage the end surface of the gate structure 140. In this embodiment, the source and drain contact enclosure structures 131S, 131D abut the entire long sidewalls of the gate structure 140 in the gate width direction of the device.

FIG. 4B is a plan view of the device 100 wherein separate material layers 112, each positioned above a single active region, were formed above the substrate, as depicted in the right-hand side of FIG. 2D. In that case, another layer of insulating material 116 was formed between the spaced-apart regions of the material layer 112. In the example depicted in FIG. 4B, the gate trench 136 was formed entirely within the material layer 112. As can be seen in FIG. 4B, as before, the "spacer" portions 112X of the individual, spaced-apart material layers 112 have a substantially uniform thickness 112Y along the gate structure for the entire distance length 113 of the active region (in the gate width direction of the device). Given that the material layer 112 was, in this example, formed as a discreet, individual layer of material, at locations where the gate structure extends beyond the active region, the gate structure is protected by larger or wider amounts of the material layer 112. For example, arbitrary dashed lines 117 have been added to FIG. 4B to indicate what is additional encapsulation material for the end regions of the gate structure that extend beyond the active region. This additional encapsulation material is obviously thicker than the thickness 112Y of the "spacers" 112X positioned adjacent the longer sidewalls of the gate structure. With continuing reference to FIGS. 4B and 2R, the material layer 112 is a separate, but locally continuous layer of material having formed therein the above-described spaced-apart source and drain contact enclosure structures 131S, 131D, and the gate enclosure structures 131G. In this embodiment, as with the embodiment shown in FIG. 4A, the source and drain contact enclosure structures 131S, 131D abut the entire long sidewalls of the gate structure 140 in the gate width direction of the device.

FIG. 4C is a plan view of the device 100 wherein separate material layers 112 that are each positioned above a single active region were formed above the substrate, as depicted in the right-hand side of FIG. 2D. In that case, another layer of insulating material 116 was formed between the spaced-apart regions of the material layer 112. In the example depicted in FIG. 4C, the gate trench 136 was formed such that it extends beyond the material layer 112 and into the insulating material 116, i.e., almost all of the long sidewalls of the gate trench 136 are defined by the material layer 112, while the insulation material 116 defines the remaining walls of the gate trench 136. As can be seen in FIG. 4C, as before, the "spacer" portions 112X of the individual, spaced-apart material layers 112 have a substantially uniform thickness 112Y along the gate structure for the entire distance length 113 of the active region (in the gate width direction of the device). Given that the material layer 112 was, in this example, formed as a discreet, individual layer of material, at locations where the gate structure extends beyond the active region, the gate structure is protected by larger or wider amounts of the material layer 112. For example, arbitrary dashed lines 121 have been added to FIG. 4C to indicate what is additional encapsulation material 112 for the portions of the gate structure that extend beyond the active region. This additional encapsulation material 121 is obviously thicker than the thickness 112Y of the "spacers" 112X positioned adjacent the longer sidewalls of the gate structure. Additionally, in this particular example, portions of the gate structure are also protected by portions of the layer of insulating material 116. With continuing reference to FIGS. 4B and 2R, the material layer 112 is a non-continuous layer of material having formed therein the above-described spaced-apart source and drain contact enclosure structures 131S, 131D. As depicted, in the example, the source and drain contact enclosure structures 131S, 131D are separated by the gate structure 140. In this embodiment, a combination of portions of the material layer 112 and the insulating material 116 surrounding the material layer 112 serve as the gate enclosure structures 133G. In this embodiment, the source and drain contact enclosure structures 131S, 131D abut most, but not the entire length of the long sidewalls of the gate structure 140 in the gate width direction of the device.

As will be appreciated by those skilled in the art after a complete reading of the present application, a novel transistor device has been disclosed herein. More specifically, one embodiment of the device disclosed herein includes, among other things, an active region defined in a semiconductor substrate, a layer of material 112 positioned above at least the entire active region, a plurality of laterally spaced-apart source/drain trenches 126 formed in the layer of material 112 above the active region, a conductive source/drain contact structure 146 formed within each of the source/drain trenches 126, a gate trench 136 formed in the layer of material 112 between the spaced-apart source/drain trenches 126 in the layer of material 112, wherein portions 112X of the layer of material 112 remain positioned between the source/drain trenches 126 and the gate trench 136, a gate structure 140 positioned within the gate trench 136 and a gate cap layer 142 positioned above the gate structure 140. In the depicted example, the gate structure 140 abuts and engages the sidewalls of the gate trench 136, while each of the conductive source/drain contact structures abuts and engages the sidewalls of its corresponding source/drain trench 126.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a device, comprising:

forming a layer of material above at least an entire active region of a semiconductor substrate;

forming a plurality of laterally spaced-apart source/drain trenches in said layer of material above said active region;

performing at least one process operation through said spaced-apart source/drain trenches to form doped source/drain regions of said device;

after forming said doped source/drain regions of said device, forming a gate trench at least partially in said layer of material between said spaced-apart source/drain trenches in said layer of material, wherein portions of said layer of material remain positioned between said source/drain trenches and said gate trench;

forming a gate structure within said gate trench; and forming a gate cap layer above said gate structure positioned within said gate trench.

2. The method of claim 1, wherein said device is a FinFET device and wherein said source/drain regions are each comprised of at least one fin.

3. The method of claim 1, wherein said device is a planar device and wherein said source/drain regions are comprised of a substantially uniform layer of semiconductor material having a substantially uniform and planar upper surface.

4. The method of claim 1, wherein said gate structure is comprised of a high-k gate insulation material layer and a layer of conductive material positioned above said high-k gate insulation material layer.

5. The method of claim 1, further comprising forming a conductive source/drain contact structure within each of said source/drain trenches prior to forming said gate structure.

6. The method of claim 1, further comprising forming a conductive source/drain contact structure within each of said source/drain trenches after forming said gate structure.

7. The method of claim 1, further comprising, after forming said doped source/drain regions, forming an epi semiconductor material on said active region.

8. The method of claim 1, wherein said layer of material is a material having a dielectric constant equal to or less than 7.

9. The method of claim 1, wherein performing said at least one process operation to form said doped source/drain regions of said device comprises performing a conformal doping process to introduce dopant material into said active region.

10. The method of claim 1, wherein performing said at least one process operation to form said doped source/drain regions of said device comprises forming an in situ doped epi semiconductor material in said source/drain trenches.

11. The method of claim 1, wherein performing said at least one process operation to form said doped source/drain regions of said device comprises forming an undoped epi semiconductor material in said source/drain trenches and thereafter implanting dopant ions into at least said undoped epi semiconductor material.

12. The method of claim 1, wherein said gate trench is formed entirely within said layer of material.

13. A method of forming a device, comprising:

forming a layer of material above at least an entire active region of a semiconductor substrate;

forming a plurality of laterally spaced-apart source/drain trenches in said layer of material above said active region;

performing at least one process operation through said spaced-apart source/drain trenches to form doped source/drain regions of said device;

after forming said doped source/drain regions of said device, forming a gate trench at least partially in said layer of material between said spaced-apart source/drain trenches in said layer of material, wherein portions of said layer of material remain positioned between said source/drain trenches and said gate trench;

forming a gate structure within said gate trench;

forming a gate cap layer above said gate structure positioned within said gate trench; and forming a conductive source/drain contact structure within each of said source/drain trenches after forming said gate cap layer.

14. The method of claim 13, wherein said layer of material is a material having a dielectric constant equal to or less than 7.

15. The method of claim 13, wherein said gate structure is formed such that it abuts and engages sidewalls of said gate trench.

16. The method of claim 13, wherein said conductive source/drain contact structure is formed such that it abuts and engages sidewalls of said source/drain trench.

17. The method of claim 15, wherein said conductive source/drain contact structure is formed such that it abuts and engages sidewalls of said source/drain trench.

18. The method of claim 13, wherein performing said at least one process operation to form said doped source/drain regions of said device comprises performing a conformal doping process to introduce dopant material into said active region.

19. The method of claim 13, wherein performing said at least one process operation to form said doped source/drain regions of said device comprises forming an in situ doped epi semiconductor material in said source/drain trenches.

20. The method of claim 13, wherein performing said at least one process operation to form said doped source/drain regions of said device comprises forming an undoped epi semiconductor material in said source/drain trenches and thereafter implanting dopant ions into at least said undoped epi semiconductor material.

21. The method of claim 13, wherein said gate trench is formed entirely within said layer of material.

22. A method of forming a device, comprising:

forming a layer of material above at least an entire active region of a semiconductor substrate;

forming a plurality of laterally spaced-apart source/drain trenches in said layer of material above said active region;

performing at least one process operation through said spaced-apart source/drain trenches to form doped source/drain regions of said device;

after forming said doped source/drain regions of said device, forming a conductive source/drain contact structure within each of said source/drain trenches;

after forming said conductive source/drain contact structures, forming a gate trench at least partially in said layer of material between said spaced-apart source/drain trenches in said layer of material, wherein portions of said layer of material remain positioned between said source/drain trenches and said gate trench;

forming a gate structure within said gate trench; and forming a gate cap layer above said gate structure positioned within said gate trench.

23. The method of claim 22, wherein said layer of material is a material having a dielectric constant equal to or less than 7.

24. The method of claim 22, wherein said gate structure is formed such that it abuts and engages sidewalls of said gate trench.

25. The method of claim 22, wherein said conductive source/drain contact structure is formed such that it abuts and engages sidewalls of said source/drain trench.

26. The method of claim 24, wherein said conductive source/drain contact structure is formed such that it abuts and engages sidewalls of said source/drain trench.

27. The method of claim 22, wherein performing said at least one process operation to form said doped source/drain regions of said device comprises performing a conformal doping process to introduce dopant material into said active region.

28. The method of claim 22, wherein said gate trench is formed entirely within said layer of material.

29. A method of forming a device, comprising:
   forming a layer of material above at least an entire active region of a semiconductor substrate;
   forming a plurality of laterally spaced-apart source/drain trenches in said layer of material above said active region;
   performing at least one process operation through said spaced-apart source/drain trenches to form doped source/drain regions of said device;
   forming a gate trench at least partially in said layer of material between said spaced-apart source/drain trenches in said layer of material, thereby defining remaining portions of said layer of material positioned above said active region between said source/drain trenches and said gate trench, wherein an upper surface of said remaining portions of said layer of material above said active region have substantially the same width in a gate-length direction of said device;
   forming a gate structure within said gate trench; and
   forming a conductive source/drain contact structure within each of said source/drain trenches.

30. The method of claim 29, wherein said gate structure is formed prior to the formation of said conductive source/drain contact structures.

31. The method of claim 29, wherein said gate structure is formed after the formation of said conductive source/drain contact structures.

* * * * *